US010177742B2

(12) United States Patent
Nguyen et al.

(10) Patent No.: US 10,177,742 B2
(45) Date of Patent: Jan. 8, 2019

(54) ACTIVE RESONATOR SYSTEM WITH TUNABLE QUALITY FACTOR, FREQUENCY, AND IMPEDANCE

(71) Applicant: THE REGENTS OF THE UNIVERSITY OF CALIFORNIA, Oakland, CA (US)

(72) Inventors: Clark T.-C. Nguyen, Oakland, CA (US); Thura Lin Naing, Berkeley, CA (US); Tristan O. Rocheleau, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/351,047

(22) Filed: Nov. 14, 2016

(65) Prior Publication Data

US 2017/0126206 A1    May 4, 2017

Related U.S. Application Data

(63) Continuation of application No. PCT/US2015/031251, filed on May 15, 2015.
(Continued)

(51) Int. Cl.
*H03H 11/04* (2006.01)
*H03H 9/24* (2006.01)
(Continued)

(52) U.S. Cl.
CPC ......... *H03H 11/0466* (2013.01); *H01F 27/29* (2013.01); *H03H 9/2426* (2013.01);
(Continued)

(58) Field of Classification Search
CPC .......... H04B 10/2575; H04B 2210/006; H04B 10/505; H04B 10/50577; H04B 10/85;
(Continued)

(56) References Cited

U.S. PATENT DOCUMENTS 7,130,579 B1 * 10/2006 Rael ...................... H03B 21/01
                                                                455/20
7,301,392 B2 * 11/2007 Hinrichs ............ H03H 11/1252
                                                                327/336
(Continued)

OTHER PUBLICATIONS

Korean Intellectual Property Office (KIPO), International Search Report and Written Opinion, dated Aug. 27, 2015, related PCT International Application No. PCT/US2015/031251, pp. 1-14, with claims searched, pp. 15-27.

*Primary Examiner* — John W Poos
(74) *Attorney, Agent, or Firm* — O'Banion & Ritchey LLP; John P. O'Banion

(57) ABSTRACT

Active feedback is used with two electrodes of a four-electrode capacitive-gap transduced wine-glass disk resonator to enable boosting of an intrinsic resonator Q and to allow independent control of insertion loss across the two other electrodes. Two such Q-boosted resonators configured as parallel micromechanical filters may achieve a tiny 0.001% bandwidth passband centered around 61 MHz with only 2.7 dB of insertion loss, boosting the intrinsic resonator Q from 57,000, to an active Q of 670,000. The split capacitive coupling electrode design removes amplifier feedback from the signal path, allowing independent control of input-output coupling, Q, and frequency. Controllable resonator Q allows creation of narrow channel-select filters with insertion losses lower than otherwise achievable, and allows maximizing the dynamic range of a communication front-end without the need for a variable gain low noise amplifier.

34 Claims, 14 Drawing Sheets

Related U.S. Application Data

(60) Provisional application No. 61/993,554, filed on May 15, 2014.

(51) Int. Cl.
  *H03H 9/46* (2006.01)
  *H03H 9/52* (2006.01)
  *H01F 27/29* (2006.01)
  *H03H 9/64* (2006.01)

(52) U.S. Cl.
  CPC .......... *H03H 9/2436* (2013.01); *H03H 9/465* (2013.01); *H03H 9/525* (2013.01); *H03H 9/64* (2013.01); *H03H 11/0472* (2013.01)

(58) Field of Classification Search
  CPC ........ H04B 14/006; H04B 7/14; H04B 17/19; H04B 1/22; H04B 1/26; H04B 1/40
  USPC .......................... 333/186, 199; 455/323, 333
  See application file for complete search history.

(56) References Cited

U.S. PATENT DOCUMENTS

| | | | |
|---|---|---|---|
| 7,436,271 B2* | 10/2008 | Weinstein | H03H 3/0072 333/186 |
| 2007/0119232 A1* | 5/2007 | Konno | G01N 29/036 73/24.01 |
| 2009/0009269 A1 | 1/2009 | Nguyen et al. | |
| 2011/0025426 A1 | 2/2011 | Steeneken et al. | |
| 2011/0150031 A1 | 6/2011 | Abdelmoneum et al. | |
| 2013/0127534 A1 | 5/2013 | Badillo et al. | |

\* cited by examiner

ACTIVE RESONATOR SYSTEM WITH TUNABLE QUALITY FACTOR, FREQUENCY, AND IMPEDANCE

CROSS-REFERENCE TO RELATED APPLICATIONS

This application is a 35 U.S.C. § 111(a) continuation of PCT international application number PCT/US2015/031251 filed on May 15, 2015, incorporated herein by reference in its entirety, which claims priority to, and the benefit of, U.S. provisional patent application Ser. No. 61/993,554 filed on May 15, 2014, incorporated herein by reference in its entirety. Priority is claimed to each of the foregoing applications.

The above-referenced PCT international application was published as PCT International Publication No. WO 2015/176041 on Nov. 19, 2015, which publication is incorporated herein by reference in its entirety.

STATEMENT REGARDING FEDERALLY SPONSORED RESEARCH OR DEVELOPMENT

This invention was made with Government support under FA9550-10-1-0293 awarded by the Department of Defense, Defense Advanced Research Projects Agency (DARPA). The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to filters, and more particularly to filters using microelectromechanical systems (MEMS)

2. Background Discussion

Power consumption in electronics is a continual area of research. Lower power produces longer device life, and hopefully leads to sensor motes that will never require battery replacement during their useful lifetimes.

BRIEF SUMMARY

A basic Q-boosted filter uses active feedback to boost an intrinsic Q of a MEMS resonator. Combing multiple such resonators, either mechanically or electrically, allows construction of filters with narrower passband and improved loss compared with unboosted resonator elements. In one embodiment, the base resonator uses a four electrode resonator to enable boosting of the intrinsic disk resonator Q, and to allow independent control of insertion loss across the two other electrodes.

In one example, two such Q-boosted resonators are configured as parallel micromechanical filters to achieve a tiny 0.001% bandwidth passband centered around 61 MHz with only 2.7 dB of insertion loss, by boosting the intrinsic disk resonator Q from 57,000, to an active Q of 670,000.

The split capacitive coupling electrode design removes amplifier feedback from the signal path, allowing for the independent control of input-output coupling, Q, and frequency. Controllable resonator Q allows creation of narrow channel-select filters with insertion losses lower than otherwise achievable, and allows maximizing the dynamic range of a communication front-end without the need for a variable gain low noise amplifier.

Active feedback is used with two electrodes of a four-electrode capacitive-gap transduced wine-glass disk resonator to enable boosting of an intrinsic resonator Q and to allow independent control of insertion loss across the two other electrodes. This Q-boosting filter approach applies to many other resonator varieties beyond this example capacitive-gap device, however.

Controllable resonator Q allows for the creation of narrow channel-select filters with insertion losses lower than otherwise achievable, and allows maximizing the dynamic range of a communication front-end without the need for a variable gain low noise amplifier. By foregoing the LNA, power consumption is reduced, allowing for filters that operate in the sub-mW range.

By using two such Q-boosted filters in parallel, a nearly flat, but extremely narrow, pass band may be produced. Signals outside the pass band are quickly attenuated.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

I. Introduction

Figure 1:
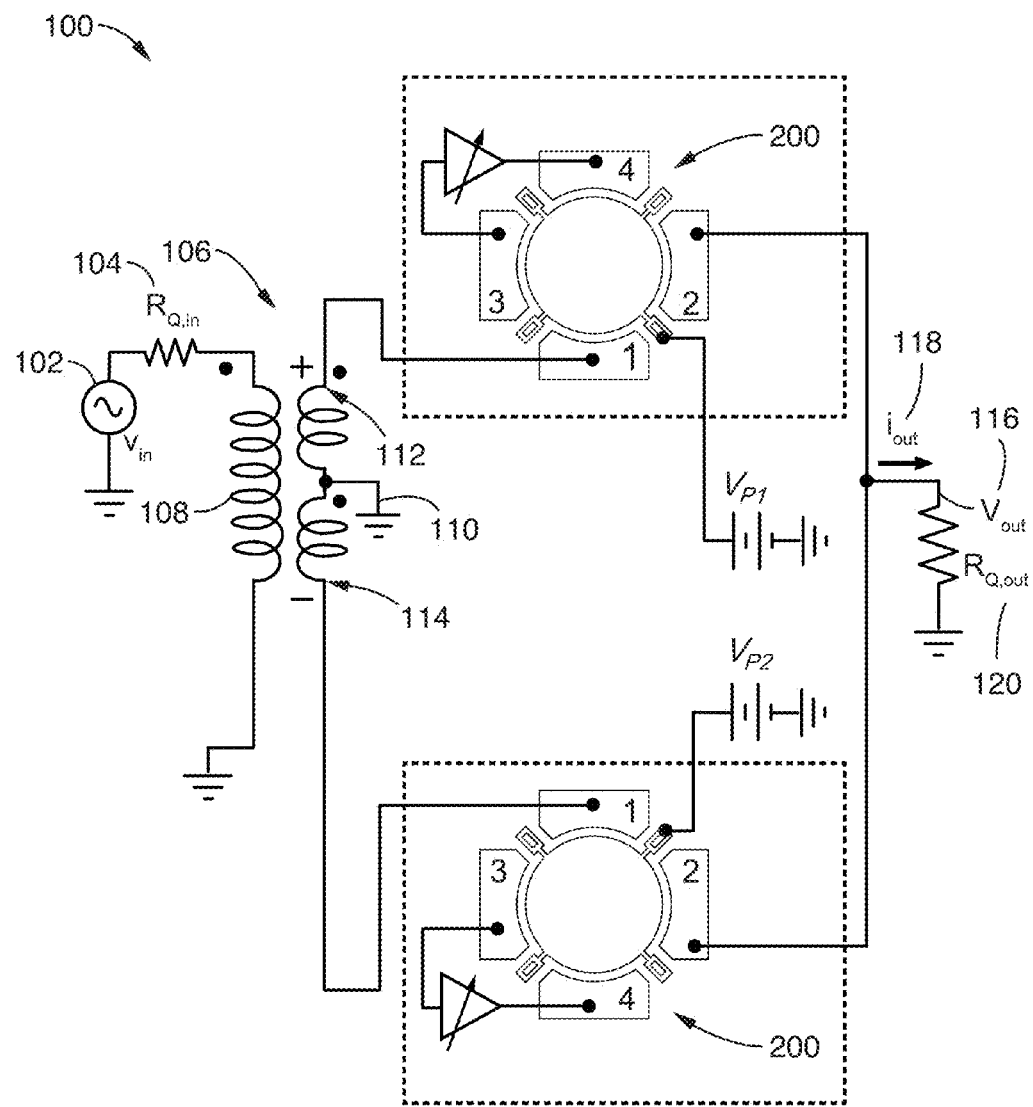
FIG. 1 is a schematic of a Q-boosted parallel filter comprised of two independent wine-glass disk resonator and amplifier circuits, all in a typical measurement circuit.

The increasing role of wireless technology in our daily lives is accompanied by a need for reduced radio power consumption. This will be especially important as wireless devices become ubiquitous, going beyond the smart phones of today to perhaps networks of more than a trillion autonomous sensors of tomorrow—sensors for which no one wants to replace batteries. Among components in a typical radio receiver, the front-end filters play a pivotal role in reducing power consumption. In particular, by removing unwanted blockers before they reach front-end electronics, these filters allow such electronics to operate with lower dynamic range than would otherwise be needed, hence, with lower power consumption.

From this perspective, the high-Q surface acoustic wave (SAW) and thin film acoustic resonator (FBAR) vibrating mechanical devices that make up today's radio frequency (RF) bandpass filters are already responsible for significant power savings in wireless handsets. Indeed, their Qs in the low thousands make possible 3% bandwidth filters that reject potentially large out-of-band interferers immediately after the antenna, allowing for significant low noise amplifier (LNA) and mixer dynamic range reductions.

Still, there is room for improvement. In particular, although good enough to select a frequency band of many channels, the Qs attainable by commercial resonator technology are not sufficient to realize filters with bandwidths small enough to select single channels. If possible, such a capability would allow removal of not only out-of-band interferers, but also in-band ones. This would then provide several orders more reduction in power consumption, not just from reduced dynamic range, but also due to the availability of much more efficient receiver architectures when there are no interferers.

Unfortunately, the resonator Q required for such a channel-selecting filter is quite daunting. For example, a 400-kHz bandwidth filter designed to select a single 200-kHz wide GSM-850 channel (and reject all others) would need constituent resonators with Qs greater than 15,000 to maintain less than 2 dB of insertion loss (IL). Along similar lines, sensor network nodes with much smaller data transfer needs might benefit from even smaller channel bandwidths, on the order of only a few kHz, which at 433 MHz would represent only 0.002% bandwidth, for which resonator Qs on the order of 370,000 would be required!

Meanwhile, though commercial technologies such as FBARs are sufficient for typical band select usage, the Qs attainable still often limit performance for narrower band usage. If the Qs could be improved from the current values of ~1000, greater flexibility would be obtained.

Pursuant to achieving the Qs desired for filters, this disclosure explores the use of active positive feedback to boost the Qs of passive resonators. In one embodiment presented here, a challenging sub-0.01% bandwidth in a parallel-class filter is demonstrated, though it will be appreciated by one of ordinary skill in the art that the individual Q-boosted resonators may be just as easily used in other filter designs, e.g. mechanically coupled filters.

In one embodiment, the use of active feedback in closed-loop with two electrodes of a four-electrode capacitive-gap transduced wine-glass disk resonator has enabled boosting of the effective resonator Q and independent control of insertion loss across the two other electrodes.

Refer now to FIG. 1, which is a schematic 100 of a Q-boosted parallel filter comprised of two independent wine-glass disk resonator and amplifier circuits (otherwise referred to as Q-boosted resonators 200), all in a typical measurement circuit.

As a first demonstration of the capability of this approach, two such Q-boosted resonators 200 are wired in the parallel-type micromechanical filter of FIG. 1, to achieve a tiny 0.001% bandwidth passband centered around 61 MHz with only 2.7 dB of insertion loss—something not otherwise known to be possible with the intrinsic resonator Q of 60,000, but quite possible with Qs actively boosted to 670,000. Unlike past efforts operating at kHz-frequencies, the split electrode design used here removes the amplifier feedback loop from the signal path allowing independent control of input-output coupling, Q, and frequency.

Generally speaking, an input signal $V_{IN}$ 102 has an input resistance $R_{Q,in}$ 104, which is connected to a transformer 106 primary 108. The transformer 106 primary 108 is coupled to the center tap 110 of the transformer 106 positive polarity connection 112 and negative polarity connection 114.

It is recognized that the balanced input signal $V_{IN}$ 102 is passing through essentially a balun to form differential inputs to the Q-boosted resonators 200. However, the differential inputs may be formed instead by a differential amplifier, an antenna, or just single-ended or differential signals directly applied to the Q-boosted resonators 200.

The Q-boosted resonators 200 act to filter the positive polarity connection 112 and negative polarity connection 114 signals, and are reconnected at the Q-boosted resonators 200 to form a Q-boosted filter output $V_{OUT}$ 116, that is characterized by standard test connection of $i_{out}$ 1118 into a load $R_{Q,out}$ 120.

II. Q and Insertion Loss Adjustable Resonator

Figure 2A:
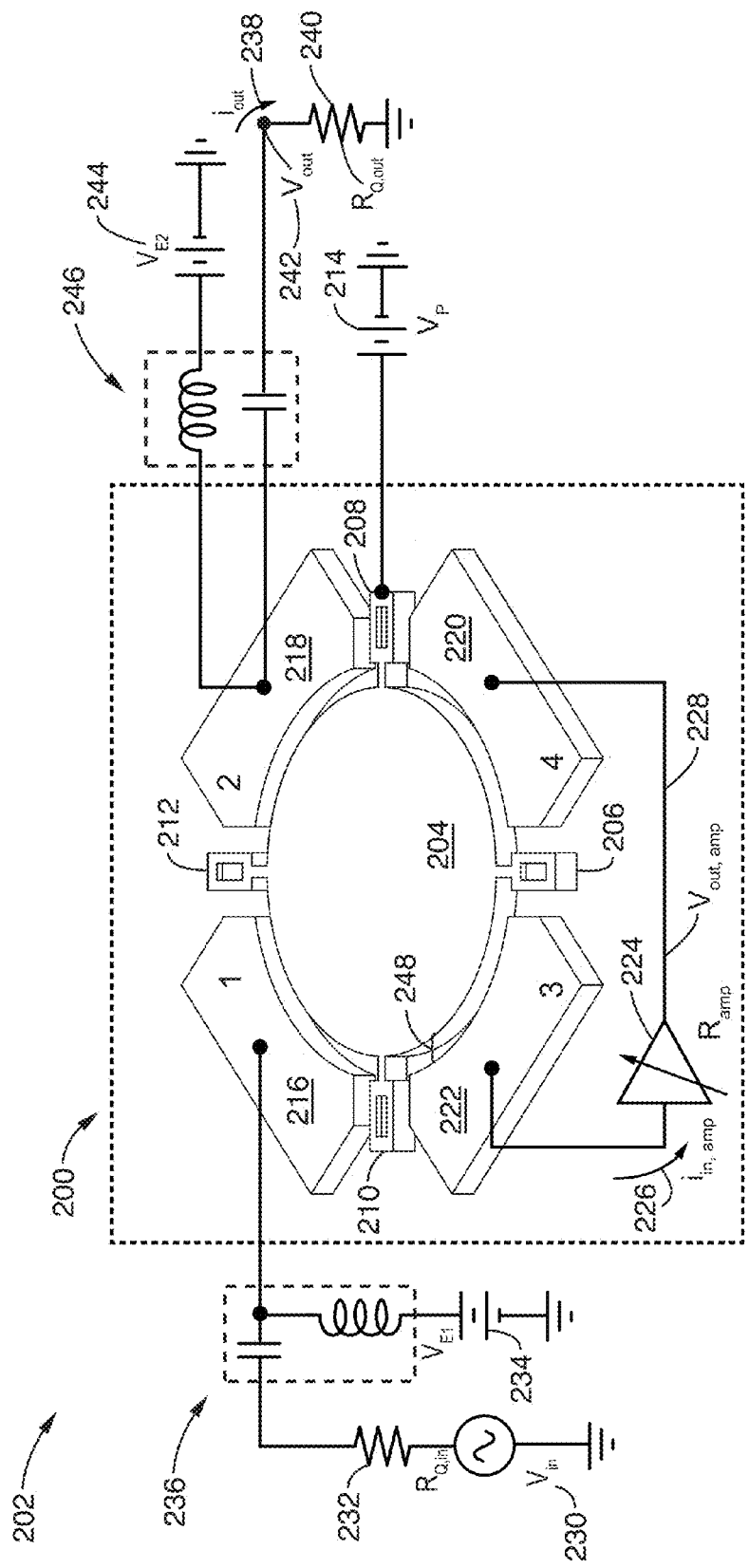
FIG. 2A is a detailed schematic of an active Q-controlled resonator, where a transimpedance amplifier provides closed-loop feedback using two electrodes of a wine-glass resonator, while the remaining two electrodes serve as input and output.
Figure 2B:
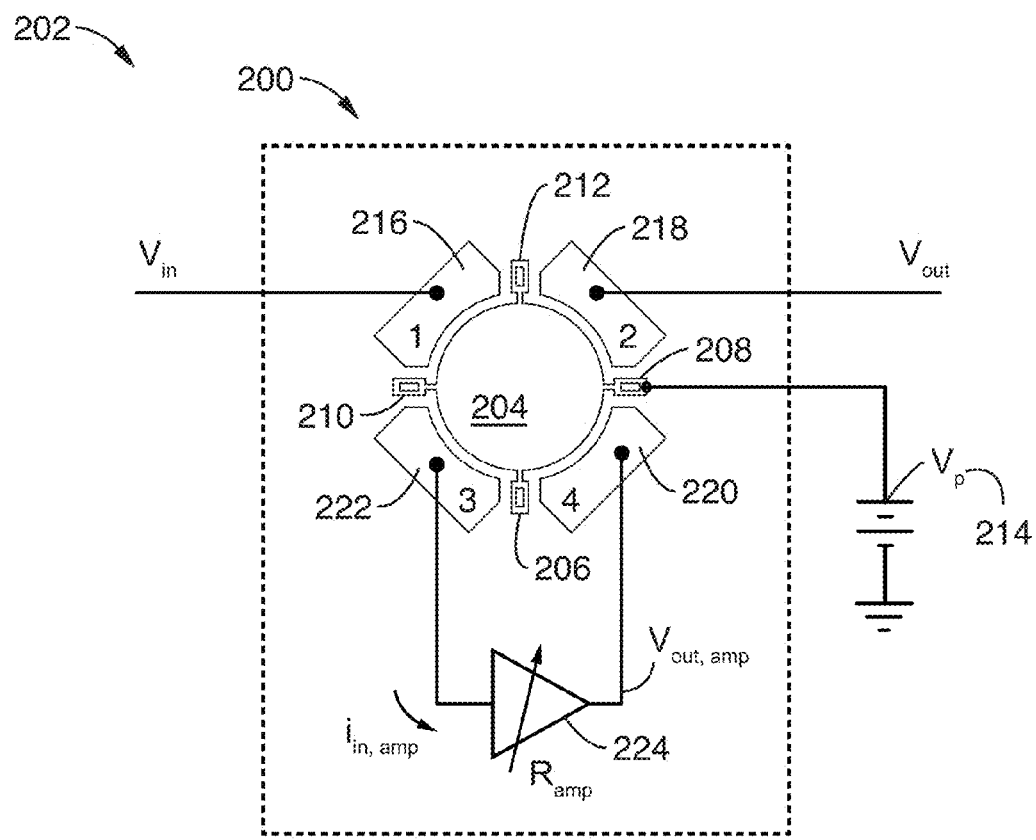
FIG. 2B is a schematic of the major components of the active Q-controlled resonator.
Figure 2C:
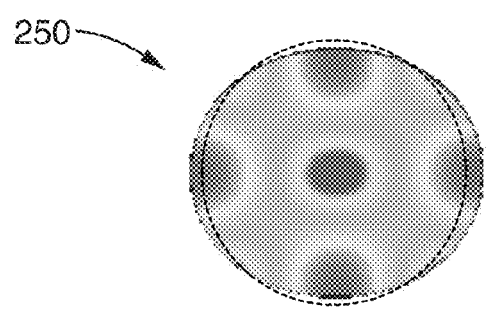
FIG. 2C is a modal analysis output depicting a mode shape of the wine-glass resonator.

Refer now to FIG. 2A through FIG. 2C, which present details of the Q-boosted resonator sub-circuit used twice in the filter circuit of FIG. 1. FIG. 2A is a detailed schematic 202 of an active Q-boosted resonator 200. A wine-glass resonator 204 is anchored 206, 208, 210, and 212 to a substrate (not shown here for the sake of clarity). The wine-glass resonator 204 is biased via voltage $V_p$ 214 through anchor 208. Electrodes 216, 218, 220, and 222 capacitively couple to wine-glass resonator 204 to provide input electrode 216, output electrode 218, and closed loop feedback electrodes 222 and 220 via a transimpedance amplifier 224. The transimpedance amplifier acts to transform an input current $i_{in,\ amp}$ 226 into an amplified output voltage $V_{out,amp}$ 228.

An input voltage $V_{in}$ 230 with source impedance $R_{Q,in}$ 232 may be fed directly to input electrode 216 (also labeled as port 1). The input voltage $V_{in}$ 230 may also be biased with a bias voltage $V_{E1}$ 234 that may be coupled through an RC network 236.

The output electrode 218 (also labeled as port 2) may also produce an output current $i_{out}$ 238 fed directly to output load $R_{Q,out}$ 240. The output voltage $V_{out}$ 242 may also be biased with a bias voltage $V_{E2}$ 244 that may be coupled through an LC network 246.

FIG. 2B shows the active Q-boosted resonator 200, which largely includes the microelectromechanical system (MEMS) wine-glass resonator 204, anchors 206, 208, 210, and 212, electrodes 216, 218, 220, and 222, and closed loop feedback 222 and 220 via a gain and phase-controllable transimpedance amplifier (TIA) 224.

The active Q-boosted resonator 200 essentially combines a wine-glass disk resonator 204 with a TIA 224. The wine-glass resonator 204 is in one embodiment constructed from a 2 μm-thick, 32 μm-radius polysilicon disk supported at quasi nodal points by four anchors 206, 208, 210, and 212 and surrounded by electrodes 216, 218, 220, and 222 spaced only 65 nm 248 from its edges.

Refer back to FIG. 2A. To excite the wine-glass resonator 204 into motion, a bias voltage $V_P$ 214 is applied to the wine-glass resonator 204 and an ac drive voltage $V_{in}$ 230 to an input electrode 216. These voltages combine to produce a force across the input electrode-to-resonator gap 248 (here about 65 nm) that at resonance can excite a wine-glass (i.e., compound (2, 1)) vibrational mode shape 250, shown in FIG. 2C, that demonstrates the expansion and contraction of the wine-glass resonator 204 along orthogonal axes.

The expression for resonance frequency takes the form:

$$f_{nom} = \frac{K}{R}\sqrt{\frac{E}{\rho(2+2\sigma)}} \tag{1}$$

where R is the disk radius, K=0.373 for a polysilicon structural material, and E, σ, and ρ are the Young's modulus, Poisson ratio, and density of the structural material, respectively.

Once vibration ensues, voltages across the electrode-to-resonator gaps 248 generate currents that then serve as electrical input/output (I/O) signals at ports 1 (electrode 216) and 2 (electrode 218) respectively; and as feedback control signals at ports 3 (electrode 222) and 4 (electrode 220) conditioned by the transimpedance amplifier 224 connected to these ports.

In the circuit of FIG. 2A, the transresistance gain of the TIA 224 adds or subtracts from the damping of the resonator to yield a total effective damping (and thus, Q) controllable up or down via the gain and phase of the transimpedance amplifier 224. If the transimpedance amplifier 224 gain and phase are configured to realize positive feedback with loop gain less than unity, then from feedback terminals 1 (electrode 216) and 2 (electrode 218) the device looks like an electrical resonator sporting a bandpass biquad transfer function like any other electrical resonator, except with extremely high Q on the order of millions. As such, its small-signal circuit model derives principally from a core LCR tank.

A. Resonator-Amplifier Electrical Model

Figure 3:
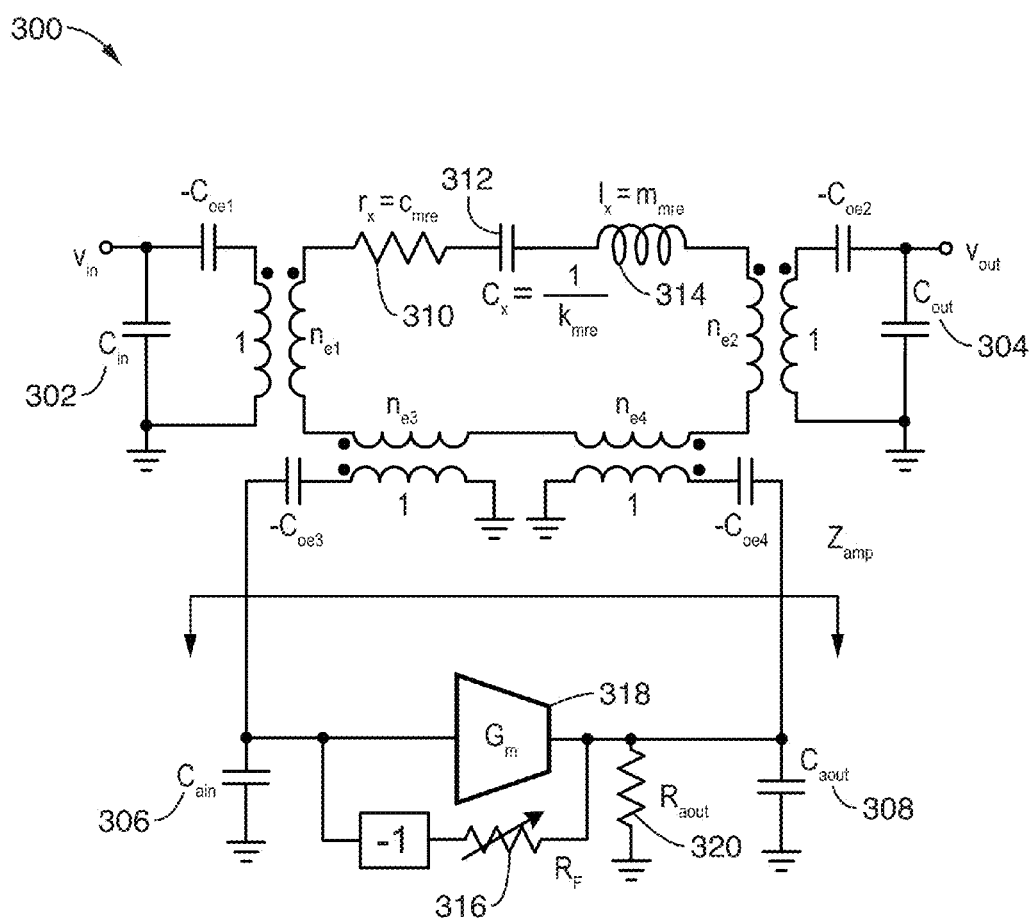
FIG. 3 is a schematic of an equivalent small signal circuit model for the Q and insertion loss adjustable of the active Q-controlled resonator of FIG. 2A through FIG. 2C, with ports 1-2 used for input and output and ports 3-4 embedded in a feedback loop with a transimpedance amplifier to enable control of Q.

Refer now to FIG. 3, which is a detailed schematic 300 of the active Q-boosted resonator 200 of FIG. 2A through FIG. 2C. To help quantify the Q attainable, FIG. 3 shows the complete small signal model of the FIG. 2A and FIG. 2B active Q-boosted resonator device, using a multi-port negative capacitance resonator equivalent circuit. Here, $C_{in}$ 302, $C_{out}$ 304, $C_{ain}$ 306, and $C_{aout}$ 308 represent capacitance derived from both: 1) intrinsic electrode-to-resonator capacitors; and 2) from parasitic capacitors surrounding the resonator structure, e.g., from wire bonding pads. In the resonator model, the values of the core LCR model are:

$$r_x = c_{mre},\ l_x = m_{mre},\ c_x = 1/k_{mre} \tag{2}$$

where $c_{mre}$ 310, $m_{mre}$ 312, and $k_{mre}$ 314 are the mechanical damping, mass, and stiffness of the resonator, respectively, determined elsewhere. In this circuit, variable negative shunt-shunt feedback resistor $R_F$ 316 operates to control the gain $G_m$ of the transimpedance amplifier 318 in conjunction with $R_{aout}$ 320.

The four capacitive-gap electrodes in FIG. 2A and FIG. 2B equate to four negative capacitor-transformer pairs, with element values of:

$$C_{oen} = \frac{\varepsilon_0 A_{on}}{d_0} \tag{3}$$

and

-continued $$\eta_{en} = V_{PEn} \frac{\partial C}{\partial r}$$

where $A_{on}$ is the static electrode-to-resonator overlap area of the $n^{th}$ electrode, $d_o$ is the electrode-to-resonator gap spacing (assumed the same for all electrodes), $\partial C/\partial r$ is the change in resonator-to-electrode capacitance per unit radial displacement, and $V_{PEn}$ is the DC voltage across the gap of the $n^{th}$ electrode: for instance, $V_{PE1}=V_P-V_{E1}$ for port 1 (electrode 216) in FIG. 2A and FIG. 2B.

Still referring to FIG. 3, by connecting a transimpedance amplifier 318 with transconductance $G_m$ and output resistance $R_{aout}$ 320, in negative shunt-shunt feedback through $R_F$ 316 gives a total impedance looking into the amplifier of:

$$Z_{amp} = \frac{-R_F A_V \omega_{in} \omega_{out}}{s^2 + (\omega_{in} + \omega_{out})s + \omega_{in}\omega_{out}(1 + A_v)} \quad (4)$$

where $$\omega_{in} = \frac{1}{R_F C_{ain}}, \quad (5)$$

$$\omega_{out} = \frac{1}{(R_F // R_{aout})C_{aout}},$$

and $$A_v = G_m(R_F // R_{aout})$$

Figure 4:
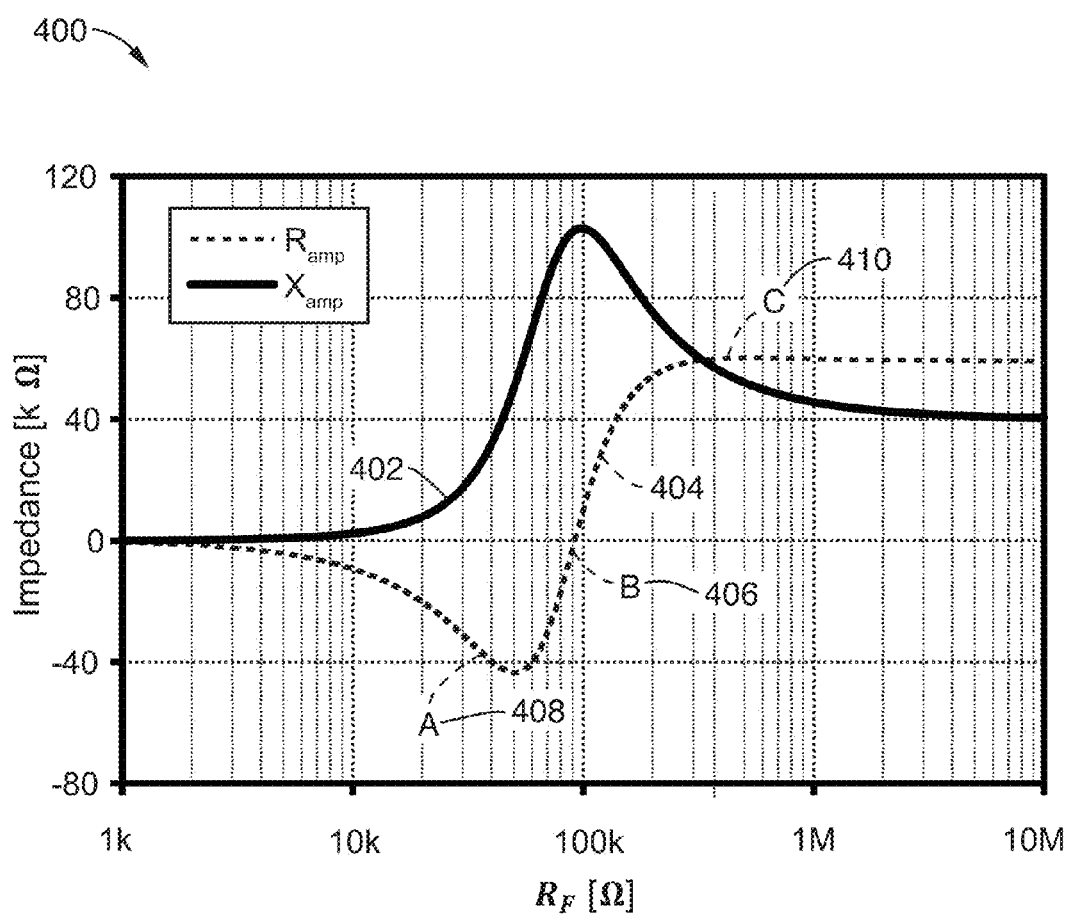
FIG. 4 is a graph of theoretically predicted resistance (dashed line) and reactance (solid line) parts of the impedance, $Z_{amp}$, looking into the TIA amplifier as the feedback resistor, $R_F$, increases, using approximate resistance and capacitance values for the amplifier for the simulation.

Refer now to FIG. 4, which is a graph 400 of theoretically predicted reactance 402 (solid line) and resistance 404 (dashed line) of the impedance, $Z_{amp}$, looking into the transimpedance amplifier (318 of FIG. 3) as the feedback resistor, $R_F$ (316 of FIG. 3), increases in resistance. Here, approximate representative resistance and capacitance values for the transimpedance amplifier in this disclosure are used for simulation.

As previously stated, FIG. 4 graphs theoretically predicted reactance 402 (solid line) and resistance 404 (dashed line) of the impedance, $Z_{amp}$, looking into the TIA amplifier (318 of FIG. 3). However, only the real (resistive) part of $Z_{amp}$ (the dashed line) influences the total effective damping of the resonator, which with this influence becomes:

$$c_{eff} = c_{mre} + R_{amp}\eta_{e3}\eta_{e4} \quad (6)$$

The resultant effective Q then takes the form $$Q_{eff} = \frac{k_{mre}}{\omega_0 c_{eff}} \quad (7)$$

which is directly controllable (up or down) via $R_F$ (316 of FIG. 3). Clearly, $Q_{eff}$ is larger than the intrinsic Q of the device when $R_{amp}$ is negative and $Q_{eff}$ is smaller when $R_{amp}$ is positive, and the transition occurs at point B 406 in FIG. 4 when:

$$R_F = \frac{G_m}{C_{in}C_{out}\omega_0^2} \quad (8)$$

The maximum $Q_{eff}$ occurs at point A 408 in FIG. 4, while the minimum occurs at point C 410. It is important to note that $c_{eff}$ (of Equation 6) must be greater than zero for the system to be stable. This means that the loop gain, T, of the feedback loop must satisfy:

$$T = \frac{-R_{amp,min}}{R_{x34}} = \frac{-R_{amp,min}}{c_{mre}/\eta_{e3}\eta_{e4}} = 1 - \frac{Q_{int}}{Q_{eff}} < 1 \quad (9)$$

where $R_{x34}$ is the motional impedance looking into electrodes 3 and 4, and $Q_{int}$ is the intrinsic Q of the resonator. In practice, the loop gain T should not be too close to unity, lest some unexpected variation, e.g., noise, acceleration, bumps it past 1, after which uncontrolled oscillation would ensue. Thus, stability considerations will likely limit the amount of Q-boost in practical design to less than 100 times that of the basic resonator.

B. Amplifier-Derived Frequency-Pulling

Refer back to FIG. 2A. During operation, the gap spacing between resonator and electrode changes (for instance gap 246), which in turn generates a changing electric field, and hence varies the electrostatic force in the gap 246. In a small-signal model, this force is in phase and proportional to disk edge displacement, and thus meets the definition of stiffness. Popularly termed electrical stiffness, this "softens" the equivalent stiffness of the resonator resulting in a negative shift in the resonance frequency. The resultant electrical stiffness generated from the gaps at port 3 and port 4 (respectively electrodes 222 and 220) is:

$$k_{e34} = \eta_{e3}\eta_{e4}\left[\frac{1}{C_{oe3}} + \frac{1}{C_{oe4}} + \omega_0 X_{amp}\right] \quad (10)$$

which subtracts from the wine-glass resonator's 204 mechanical stiffness to yield a resonance frequency $f_0$ given by:

$$f_0 = f_{nom}\sqrt{\left[1 - \frac{k_{e1} + k_{e2} + k_{e34}}{k_{mre}}\right]} \quad (11)$$

where $k_{e1}$ and $k_{e2}$ are the effective electrical stiffnesses from the gap at port 1 and 2, respectively (with ports 1 and 2 respectively labeled as electrodes 216 and 218).

C. Transimpedance Amplifier Design

Figure 5A:
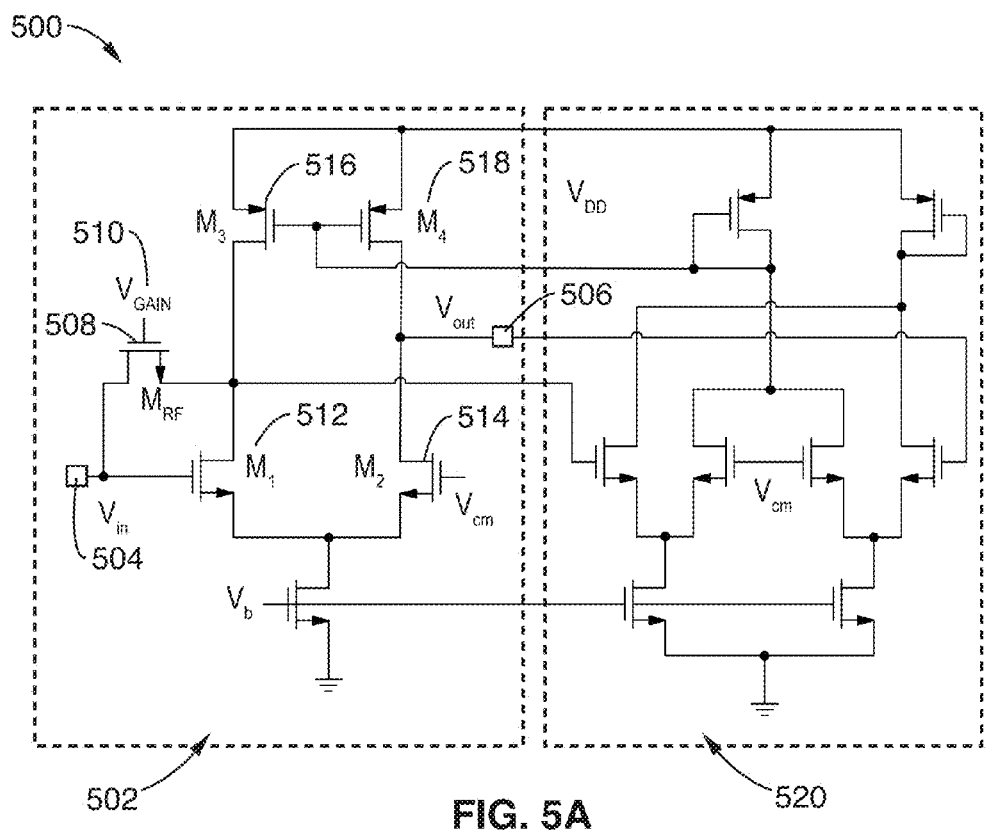
FIG. 5A is a detailed transimpedance amplifier circuit comprising a fully differential CMOS amplifier with one end connected in shunt-shunt feedback, and output taken from the other end to realize a 0° input-output phase shift. Transistor M_RF serves as a voltage controllable shunt-shunt feed-back resistor, allowing easy adjustment of TIA gain via its gate voltage $V_{GAIN}$.

Refer now to FIG. 5A, which is a detailed transimpedance amplifier 500 circuit comprising a fully differential CMOS transimpedance amplifier 502 with one end connected in shunt-shunt feedback to $V_{IN}$ 504, and output 506 taken from the other end to realize a 0° input-output phase shift. Transistor $M_{RF}$ 508 serves as the voltage controllable shunt-shunt feed-back resistor, allowing easy adjustment of transimpedance amplifier 502 gain via its gate voltage $V_{GAIN}$ 510.

Transistors M1-M4 (respectively 512, 514, 516, and 518) form the basic differential transistor pair biased by a common-mode feedback (CMFB) circuit 520 that preserves low output resistance and cancels out common-mode noise, including noise caused by vibration. The action of the CMFB circuit 520 symmetrically balances the differential pair circuit. This yields a transconductance gain ($G_m$) of 0.5 $g_{m1}$ and output resistance ($R_{aout}$) of approximately $r_{o2}//r_{o4}$, where $g_m$ and $r_o$ are transconductance and output resistance of a transistor respectively. The MOS transistor $M_{RF}$ 508 is biased in the triode region to serve as a voltage controllable shunt-shunt feedback resistor ($R_F$) that allows convenient adjustment of the TIA gain via its gate voltage, $V_{GAIN}$ 510.

Figure 5B:
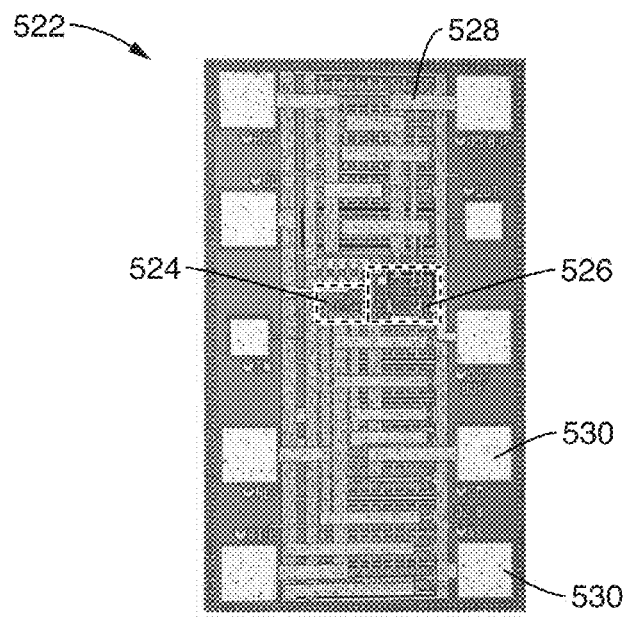
FIG. 5B is a photomicrograph of the fabricated amplifier application specific integrated circuit (ASIC).

Refer now to FIG. 5B, which is a photomicrograph of the fabricated amplifier application specific integrated circuit 522. Here, the amplifier integrated circuit 524 was fabricated in a 0.35 μm CMOS technology. Although the entire die, shown in FIG. 5B, occupies an area of 900 μm×500 μm, the actual sustaining amplifier 524 only consumes about 60 μm×60 μm. The rest of the area is consumed by 1) an on-chip buffer 526 used to drive 50Ω measurement systems; 2) by-pass capacitors 528 further reduce noise on DC supply lines; and 3) bond pads 530.

Though the embodiment demonstrated herein uses a transimpedance amplifier, it should be appreciated that many other amplifier topologies may be substituted. Indeed, any two-port amplifier can create the gain between input and output needed to achieve the Q-boosting described. Furthermore, an approach such as a negative-resistance amplifier could likewise provide the gain needed to achieve the Q control when connected to a single resonator port.

Figure 5C:
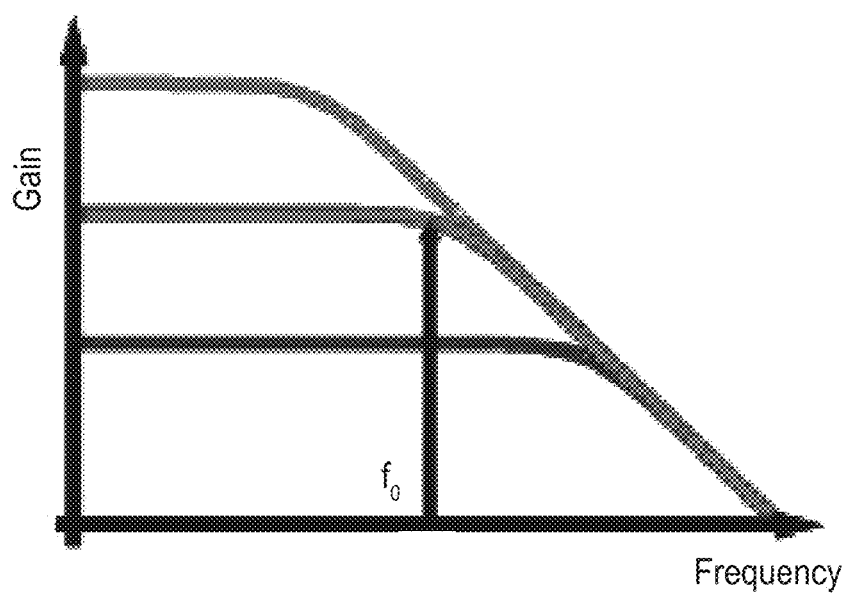
FIG. 5C is a graph of gain versus frequency of the device of FIG. 5A.
Figure 5D:
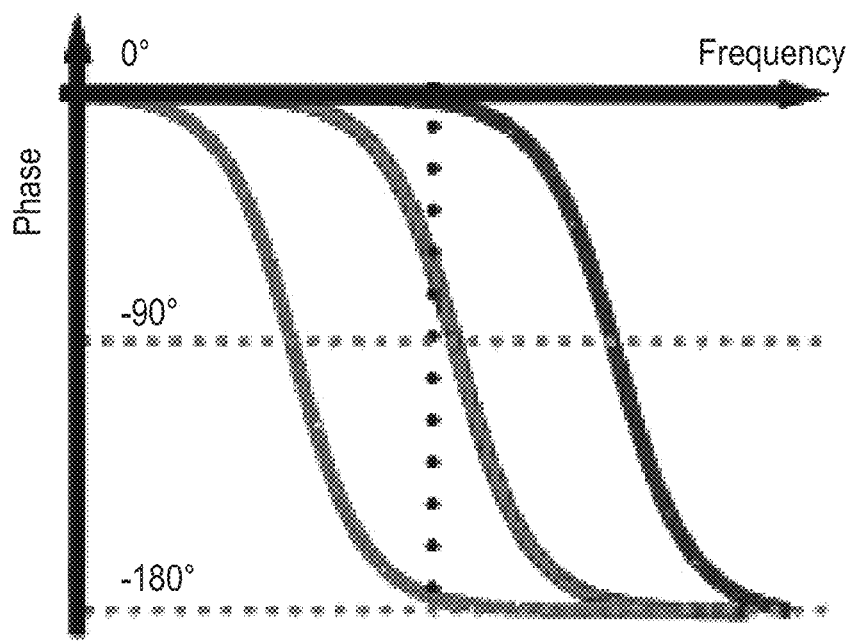
FIG. 5D is a graph of phase versus frequency of the device of FIG. 5A.

Refer now to FIGS. 5C and 5D, which describe the performance of the system of FIG. 5A. FIG. 5C is a graph of gain versus frequency of the device of FIG. 5A. Similarly, FIG. 5D is a graph of phase versus frequency of the device of FIG. 5A.

III. Active Q-Boosted Filter Implementation

Refer now to FIG. 1 once again. To create a filter response, the circuit of FIG. 1 combines into a parallel-class filter similar to that of two FIG. 2A electromechanical circuits with resonance frequencies spaced from one another by the desired passband bandwidth. A balun 102 converts a single ended input 104 at the left into a differential drive signal with plus end applied to one active Q-controlled resonator 200 input and minus to the other, so that each active Q-controlled resonator 200 receives oppositely phased inputs. The output terminals of each of the two active Q-controlled resonators 200 are then tied together so that their output currents add to form $i_{out}$ 108.

In this approach, the filter response is achieved via electrically combining the signals from both resonators. As with any mechanical filter, a filter response may equally be created by mechanically coupling the resonators via a coupling beam. In such a design, the beam forces the frequencies of the individual resonators to separate, creating a passband in the mechanical response directly.

Figure 6A:
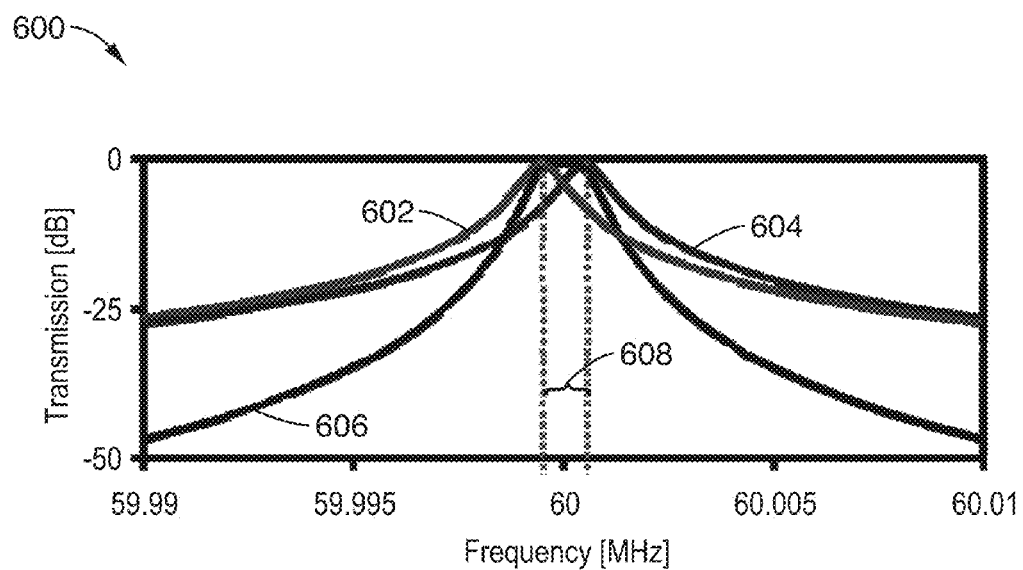
FIG. 6A is a graph of transmission versus frequency of parallel filter operation, where two differentially driven bandpass biquad responses add to form a flat passband (between the peaks) and subtract in the stopband (outside the peaks) to provide greater stopband rejection.

Refer now to FIG. 6A, which is a graph 600 of transmission versus frequency of parallel filter operation, where two differentially driven bandpass biquad responses add to form a flat passband (between the peaks) and subtract in the stopband (outside the peaks) to provide greater stopband rejection.

Here, the individual resonator spectra of Q-boosted resonator 1 602 and Q-boosted resonator 2 604 operationally combine together to form the resulting filter spectrum 606, with flat passband 608.

Figure 6B:
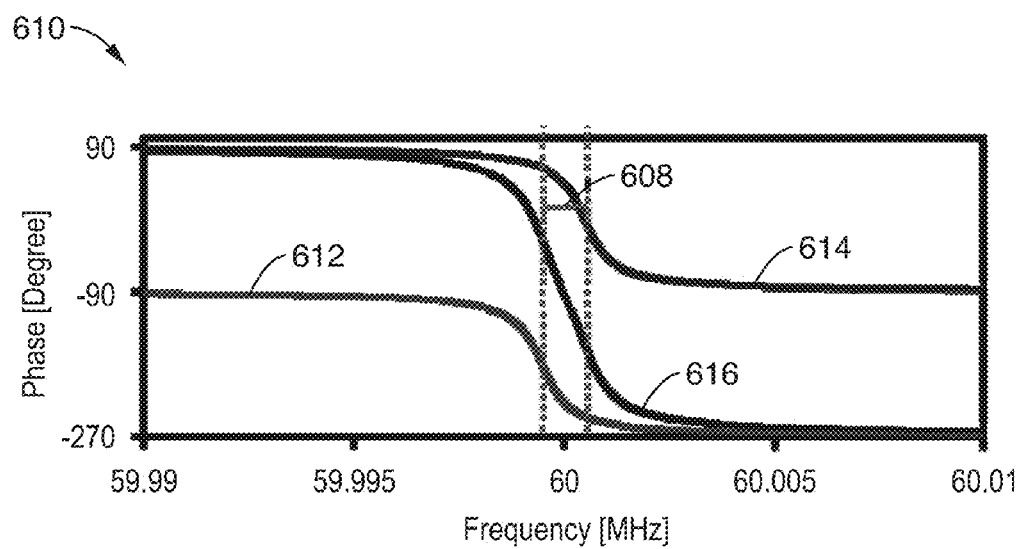
FIG. 6B is a graph of phase versus frequency of the parallel filter operation previously modeled in FIG. 6A.

Refer now to FIG. 6B, which is a graph 610 of phase versus frequency of the parallel Q-boosted filter operation modeled in FIG. 6A. As shown, the differential drive of the resonator 1 612 and resonator 2 614 produces a relative phase shift of approximately 0° in the passband 608, which allows their outputs to add to 616 form a flat filter passband between these peaks. Meanwhile, outside the passband the resonators vibrate 180° out-of-phase, giving rise to subtraction that steepens the roll-off of the stopband.

A. Adjustable Dynamic Range

Refer now back to FIG. 2A. As with any bandpass filter, the higher the Q of the constituent resonators, the lower the insertion loss. This means the insertion loss of the filter should be fully controllable by merely adjusting the gain of the Q-boosted transimpedance amplifiers 224 placed in feedback between ports 3 and 4 (electrodes 222 and 220 respectively) of each active Q-boosted resonator 200.

Figure 7A:
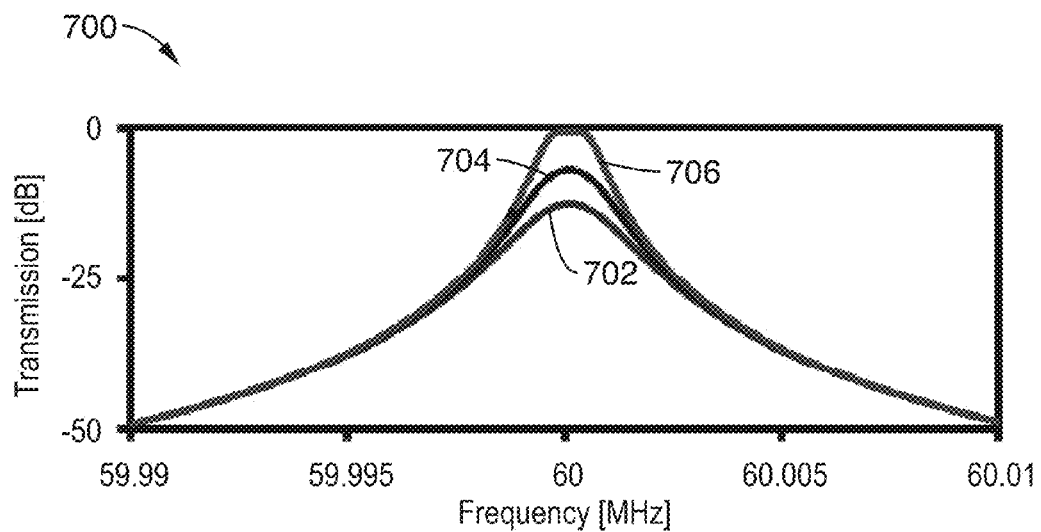
FIG. 7A is a graph of simulated parallel filter responses for a narrow 0.002% bandwidth filter with low Q (the intrinsic device Q) equivalent to $1.36 \times BW_{fil}$, Q-boosted by 2X, and 22X, for constant $R_Q$, with an insertion loss improvement of about 12 dB.

Refer now to FIG. 7A, which is a graph 700 of transmission versus frequency of the simulations of FIG. 1. Here are presented simulated parallel filter responses for a narrow 0.002% bandwidth filter with low Q (intrinsic device Q) equivalent to $1.36 \times BW_{fil}$ 702, Q-boosted by two times 704, and Q-boosted by 22 times 706. These curves show responses for constant $R_Q$ (the value needed to approximate an equivalent resistive insertion loss $R_Q$ for the highest Q case) and insertion loss improvement of 12 dB, which is the difference between the highest transmission of the $1.36 \times BW_{fil}$ 702 curve and the Q-boosted by 22 times 706 curve.

Figure 7B:
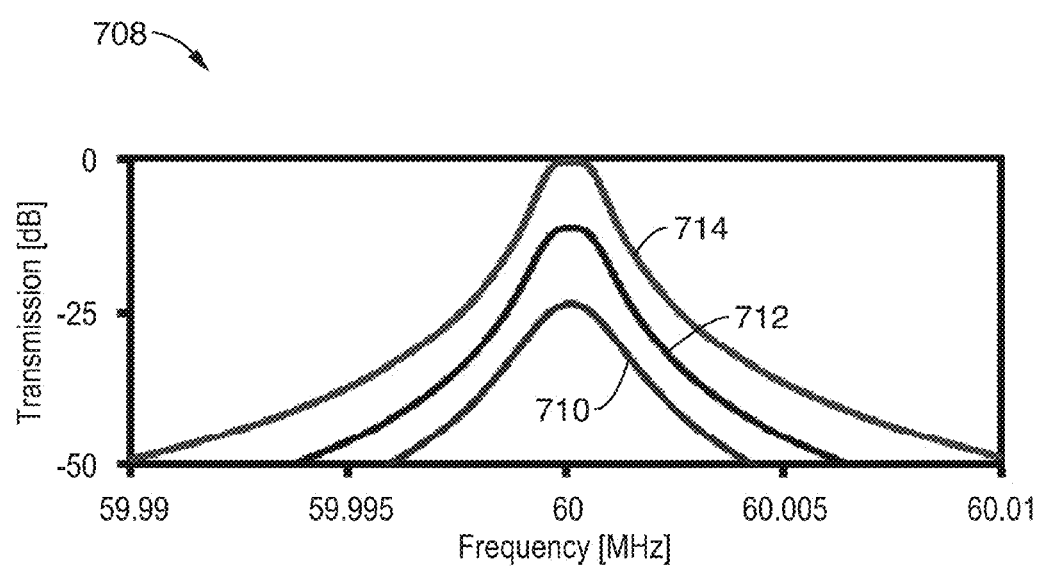
FIG. 7B is a graph of the simulated parallel filter response of FIG. 7A that illustrates that the filter can be terminated properly by adjusting the bias voltage across input and output gaps while $R_Q$ is kept constant.

Refer now to FIG. 7B, which is a graph 708 that illustrates that the filter can be terminated properly by adjusting the bias voltage across input and output gaps while $R_Q$ is kept constant. Note that the Q equivalent to $1.36 \times BW_{fil}$ 710 is too small for the filter to be terminated properly. Boosting Q by 2 times 712 improves the insertion loss by about 12 dB. Boosting Q by 22 times in curve 714 improves insertion loss by about 23 dB.

Referring now to both FIG. 7A and FIG. 7B, it appears that active Q-control not only makes possible low insertion loss even for 0.002% bandwidth filters that would not be feasible otherwise, but also enables variable gain filters, as opposed to the variable gain low noise amplifiers commonly used in radio frequency front-ends.

The curves in FIG. 7A lose their passband shape as Q is lowered, mainly because the motional resistance of the constituent active Q-boosted resonators 200 change with their Q, so the $R_{Qs}$ no longer present the needed termination. To remedy this, the electrode-to-resonator DC-bias voltages $V_{E1}$ (234 of FIG. 2A) and $V_{E2}$ (242 of FIG. 2A) can be adjusted to compensate, which then yields the curves of FIG. 7B, where the filter frequency response retains its shape even as insertion losses increase.

The ability to tune insertion loss essentially amounts to an ability to adjust dynamic range. In particular, if the input to the filter receives a signal sufficiently high in amplitude to drive it into nonlinear behavior, one need only tune the Q-controlling amplifier gain to increase insertion loss, thereby allowing reception of the signal without desensitization. In effect, this adjustable insertion loss provides an effective bias shift for dynamic range—a very useful function for any transceiver front-end.

B. Power Consumption Considerations

The use of active circuits in an otherwise passive filter implementation does introduce power consumption, where there was none before. The extra active circuits are justified only if their presence offers performance benefits beyond what might be achieved by raising power consumption elsewhere in the system, e.g., in the low noise amplifier or intermediate frequency channel-select filter (if realized using transistors). In fact, typical low noise amplifier power consumption is on the order of 5 mW, which is needed mainly to insure an adequate noise figure. Recent developments in passive transformer coupled front-ends have successfully reduced the power consumption in the low noise amplifier and mixer close to zero, but due to the lack of radio frequency channel-select filtering in traditional technologies, power on the order of 10 mW is still needed to maintain adequate linearity in the active intermediate frequency channel-select filter.

Meanwhile, the power required for the active circuits in the Q-boosting loop in the active Q-boosted resonator 200 of FIG. 2A can be sub-100 µW, making the Q-boosted MEMS approach more desirable from a power consumption standpoint. This argument becomes even more important with the recognition that the loss of a radio frequency front-end filter directly adds to the noise figure of a receiver, so lowering radio frequency filter insertion loss by several dB is often a better investment of consumed power than lowering the noise figure of a low noise amplifier by a smaller dB number.

IV. Experimental Results

Figure 8A:
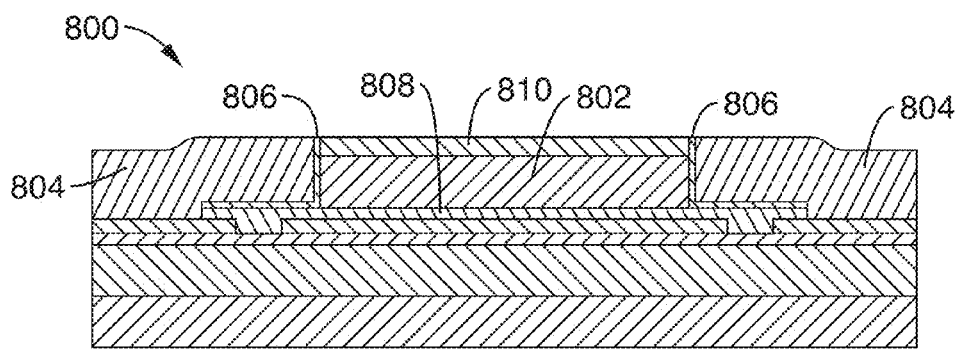
FIG. 8A is a cross section illustrating one embodiment of a MEMS resonator prior to resonator disk release in 49% HF.
Figure 8B:
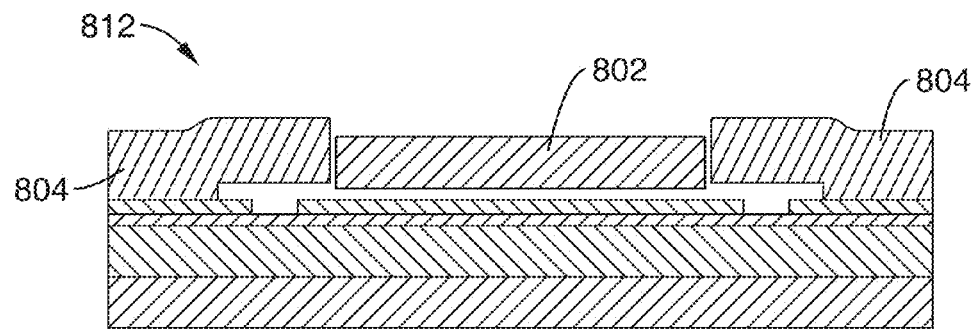
FIG. 8B is a cross section of the MEMS resonator of FIG. 8A after resonator disk release in 49% HF.
Figure 8C:
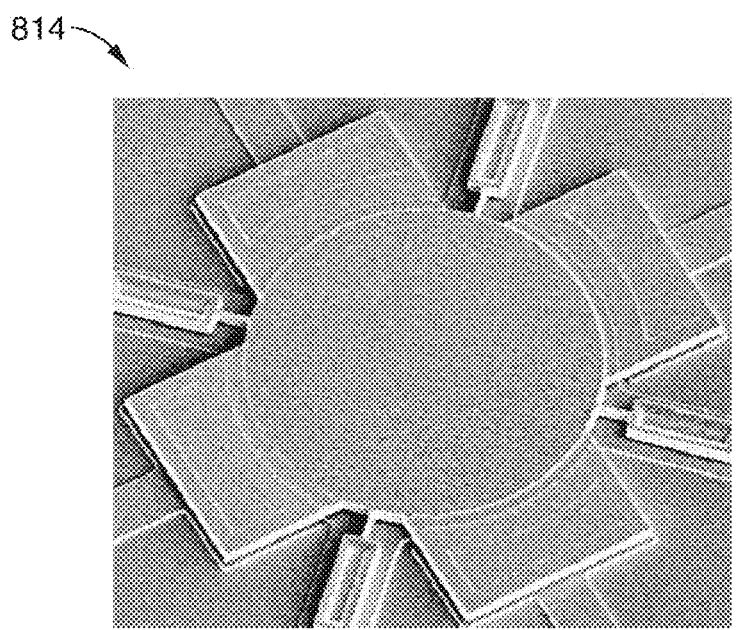
FIG. 8C is a scanning electron micrograph (SEM) of the device of FIG. 6B, which was used in this disclosure.

Refer now to FIG. 8A through FIG. 8C. To experimentally verify the utility of active Q-boosting, wine-glass resonators were designed and fabricated with a process summarized in the cross sections of FIG. 8A and FIG. 8B.

FIG. 8A is a cross section 800 illustrating one embodiment of a MEMS resonator prior to resonator disk release in 49% HF. Here, doped polysilicon serves as the structural material for resonator 802 and electrodes 804, alike, and the gaps 806 between the resonator 802 and electrodes 804 were set at 65 nm by a sacrificial high-temperature oxide spacer 808 that is removed in the final release step. The process differs from previous ones in that it removes electrode overhangs via chemical mechanical planarization (CMP)—a step that improves the reliability of devices under larger DC-bias voltages. An additional sacrificial hard mask 810 protects the top surface of the resonator 802 during some of the etching procedures.

FIG. 8B shows the cross section 812 of FIG. 8A, where the sacrificial high-temperature oxide spacer 808 (of FIG. 8A) and the additional sacrificial hard mask 810 (also of FIG. 8A) have both been removed.

FIG. 8C presents a scanning electromicrograph SEM of a fabricated device 814 of FIG. 8B following release in 49% HF. The device here has a radius of 32 µm, electrode-to-resonator gap spacing of 65 nm, and DC-bias voltage $V_P$ of 10 V. This fabricated device provides a coupling strength of $(C_x/C_o)$ ~0.04% at an operating frequency of 61 MHz, sufficient for the 0.001% bandwidth filter demonstrated here.

Figure 9A:
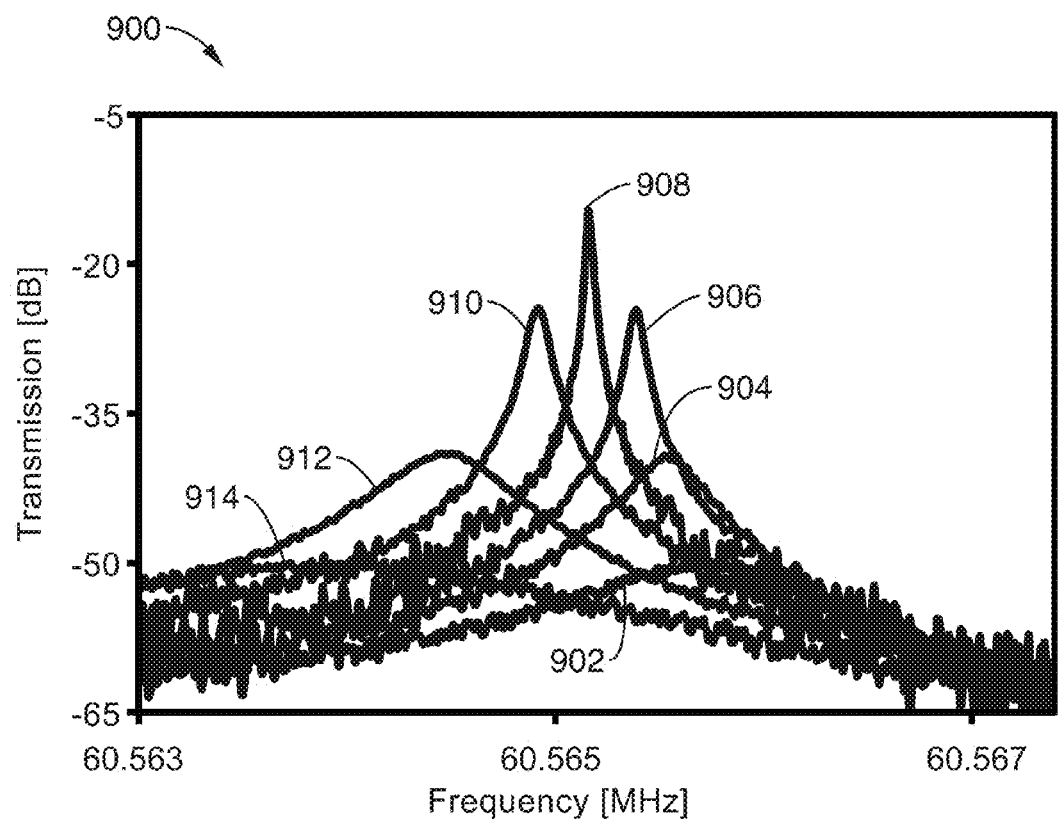
FIG. 9A is a graph of transmission versus frequency for single resonator Q-boosting as a function of amplifier gain with constant $V_P$=8.5 V.

Refer now to FIG. 9A, which is a graph 900 of transmission versus frequency for single resonator Q-boosting as a function of amplifier gain with constant $V_P$=8.5 V. These curves (902, 904, 906, 908, 910, 912, and 914) present measured electrical transmission plots for a 50Ω-terminated single disk resonator in a Q-controlling hookup (cf. FIG. 2A) as a function of transimpedance gain and phase shift. Here, insertion loss and Q are quite tunable, with effective Q adjustable anywhere from 24 k to 2.3M. Even operating at the maximum boosted Q of 2.3M, the active resonator remained stable for hours of measurement time with no evidence of oscillation, likely a result of compact implementation made possible by die-level ASIC and MEMS resonator connections previously described in FIG. 5B.

The curves of FIG. 9A also confirm that the resonance frequency shifts to the left with decreasing $V_{GAIN}$.

Figure 9B:
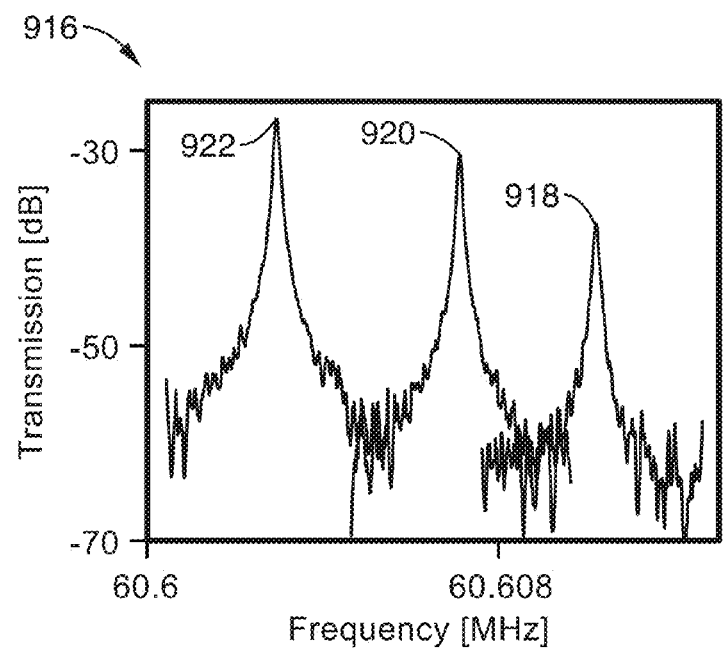
FIG. 9B is a graph of the transmission versus frequency of a single resonator Q-boosting device demonstrating independent tuning of frequency and insertion loss via control of the voltage across input-output electrode-disk gap, all while holding Q constant by holding $V_{GAIN}$ constant.

Refer now to FIG. 9B, which is a graph of transmission versus frequency 916 that further demonstrates insertion loss tuning while maintaining constant Q (by keeping $V_{GAIN}$ constant) via independent tuning of the input-output electrode to disk bias voltage, i.e., tuning $V_{E1}$ and $V_{E2}$.

As $V_{GAIN}$ is decreased amplifier gain increases, boosting effective resonator Q (902, 904, and 906 of FIG. 9A) from an initial intrinsic Q=57,000 to a maximum boosted Q of 2.3 million (908). On the other hand, decreasing $V_{GAIN}$ further allows control of amplifier phase shift, leading to negative feedback and allowing controlled loading of Q (910, 912, and 914 of FIG. 9A).

Refer now to FIG. 9B, which is a graph 916 of the transmission versus frequency of a single resonator Q-boosting device. This set of curves 918, 920, and 922 demonstrates independent tuning of frequency and insertion loss via control of the voltage across input-output electrode-disk gap, all while holding Q constant by holding $V_{GAIN}$ constant.

Figure 10:
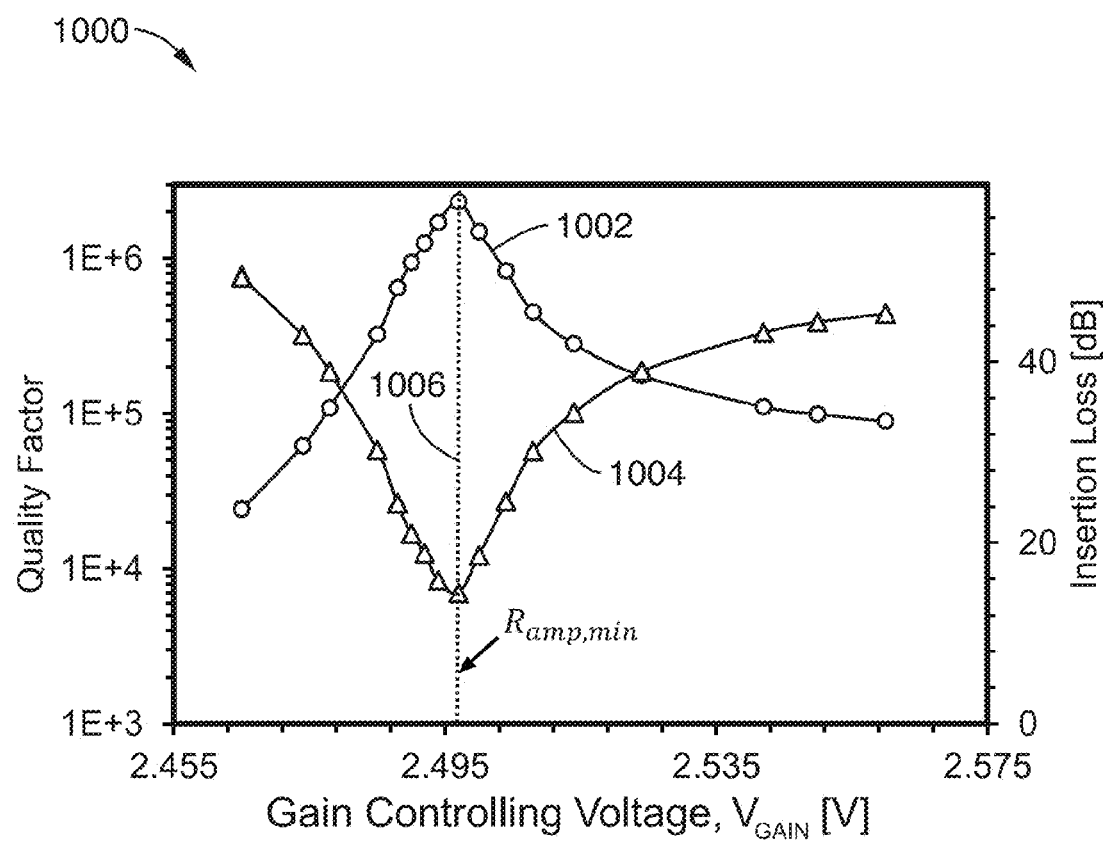
FIG. 10 is a graph of measured effective quality factor and insertion loss of the resonator with constant $V_P$=8.5 V as $V_{GAIN}$ of the amplifier changes.

FIG. 10 is a graph 1000 of Quality Factor (Q) versus gain controlling voltage. Here, measured effective quality factor 1002 and insertion loss 1004 of the resonator with constant $V_P$=8.5 V as $V_{GAIN}$ of the amplifier changes. The highest Q and lowest insertion loss occur at a little over 2.495 V 1006.

Figure 11A:
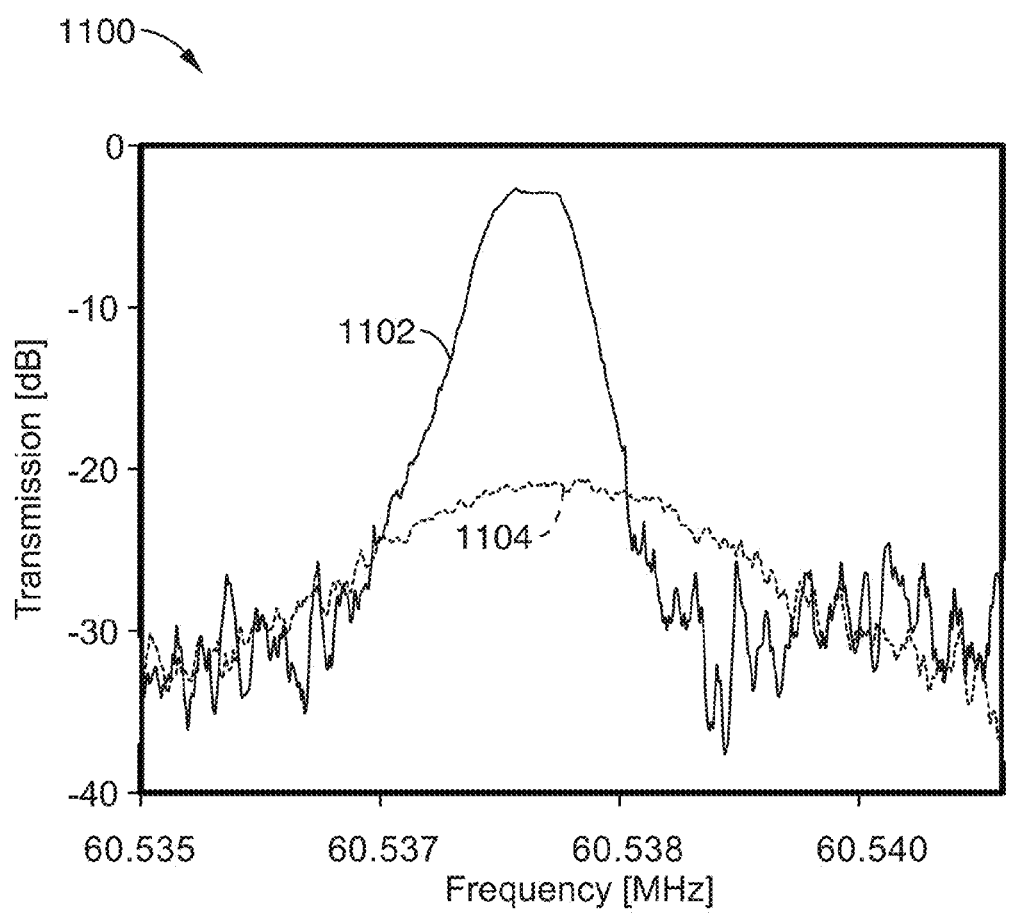
FIG. 11A is a graph of measured transmission versus frequency for a two-resonator active Q-controlled resonator arranged in a circuit as shown in FIG. 1.

Refer now to FIG. 11A, which is a graph 1100 of measured transmission versus frequency for a two-resonator active Q-boosted resonator 200 arranged in a circuit as shown in FIG. 1, and terminated by the designed (i.e., required) value of 1.7 kΩ at both input and output for the cases with 1102 and without 1104 Q-boosting transimpedance amplifiers.

Figure 11B:
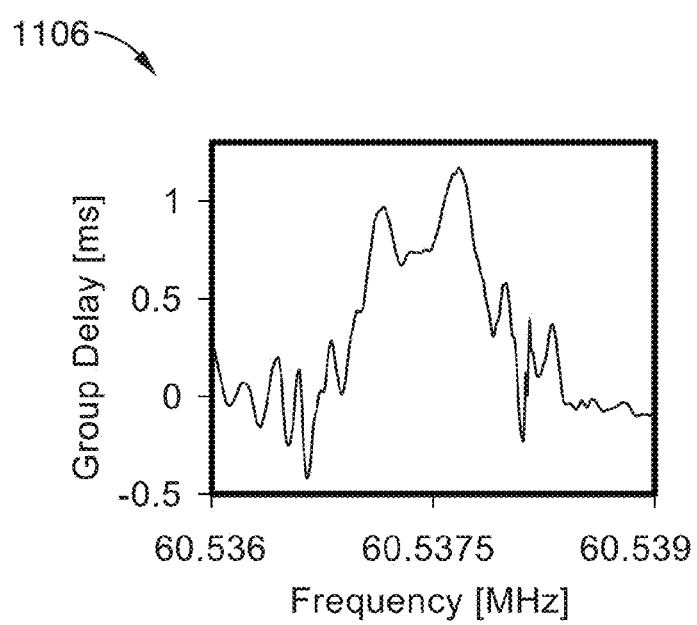
FIG. 11B is a graph of the group delay in ms versus frequency of the device previously shown in FIG. 11A.

Refer now to FIG. 11B, which is a graph 1106 of the group delay in ms versus frequency of the device previously shown in FIG. 11A in curve 1102. In both FIGS. 11A and 11B, the device parameters used were f0=60.5376 MHz, BW-600 Hz, IL=2.7 dB, RJ=30 dB, $V_{P1}$=13.4 V, Group Delay=0.7 ms, $R_Q$=1.7 kΩ, Ripple=0.3 dB, SF20 dB=2.55, and $V_{P2}$=16.5 V.

As expected, the insertion loss is a dismal 21 dB without Q-boosting of the constituent resonators (see curve 1104 of FIG. 11A); compared with only 2.7 dB when the transimpedance amplifiers boost Qs (see curve 1102 of FIG. 11A). Indeed, 2.7 dB is quite impressive for a percentage bandwidth this small.

Refer back again to FIG. 10 to verify the theoretical predictions of FIG. 4. Here, FIG. 10 additionally demonstrates the Q enhancement and subsequent improvement in insertion loss when measured with 50Ω terminations as a function of $V_{GAIN}$ applied to the amplifier. As $V_{GAIN}$ decreases, the shunt-shunt feedback resistance $R_F$ in the transimpedance amplifier increases.

As previously depicted in FIG. 4, with increasing $R_F$, $R_{amp}$ (initially a negative value and hence boosting Q) decreases to a minimum value for the maximum Q of 2.3M and the maximum loop gain of 0.975. Decreasing $V_{GAIN}$ further decreases Q (or increases $R_{amp}$) until it becomes smaller than the resonator intrinsic Q at which point $R_{amp}$ is greater than zero.

On the other hand, the stopband rejection of only 30 dB seen in FIG. 11A is less than expected. The insufficient stopband rejection actually derives from the measurement apparatus and scheme, not the device itself. In particular, the current measurement simulates the needed filter terminations using network analyzer-based load simulation, rather than a real 1.7 kΩ termination impedance, and this compromises the noise floor of the instrument. An improved measurement effort using real terminations, currently underway, is expected to improve this low rejection measurement artifact.

V. Conclusions

The demonstration in this disclosure of a 0.001% bandwidth micromechanical filter comprised of actively Q-boosted passive resonators with only 2.7 dB of insertion loss is thought to be the first of its kind on the micro-scale, and presents opportunities for implementing some very unique and desired capabilities in the near future. Opportunities to realize radio frequency channel-selecting radios were the focus of this disclosure, and the demonstrated Qs up to 2.3 million should prove very useful towards greatly lowering power consumption for the low data rate wireless communications needed for network sensors. Bandwidths as small as 0.001% might further enable noise shaping for oscillators and other applications to unprecedented performance marks.

Although this work focused on very small percent bandwidth filters, it is worthwhile to reconsider use of these techniques in more mainstream applications, like cellular communications, for which RF channel-selection still offers substantial reductions in power consumption. As previously mentioned, existing resonator technologies do not yet possess the simultaneous Q and coupling characteristics o realize such a front-end. As described in this disclosure, as long as the small additional power consumption is acceptable, active Q-boosting might be a good answer for resonators that possess adequate coupling, but insufficient Q.

In other words, RF channel-selection for piezoelectric resonators may indeed just be a few more electrodes and some active circuits away from reality, especially for piezoelectric resonators that start with decent Qs, e.g., ones using capacitive-piezo transducers, or composite material structures.

One of ordinary skill in the art will appreciate that the methods presented herein are widely applicable to a range of resonator devices which utilize a capacitive gap/coupling/transducer for transduction. Furthermore, the techniques are also applicable to resonators which are not typically actuated through this capacitive gap (e.g., piezo coupled devices). Accordingly, the disclosed teachings are applicable to a range of resonators, given by way of example and not limitation as: ring resonators (both contour mode or others, such as wine-glass ring), Lame mode resonators, bar resonators, flexural beam resonators, membrane or "drum head" resonators, comb-driven flexural-mode resonators with suitable tuning electrodes, center-supported disk resonators (e.g., using both in-plane contour, and whispering gallery modes, or various flexural mode operation), surface acoustic wave (SAW) devices, bulk acoustic wave (BAW) devices, film bulk acoustic resonator (FBAR) devices, lateral overmoded bulk acoustic-wave resonator (LOBAR) devices, or other piezo actuated resonators. Additionally, internal dielectric actuated resonators may be utilized in any of the above mode shapes, where the needed capacitive coupling is provided by the internal dielectric gap. Similarly, internally-transduced resonators, may be utilized in which the capacitive-gap is formed from a semiconductor junction, as in body-resonator transistors. Still further, the disclosed teachings may be utilized with various combinations of the above devices without departing from these disclosed teachings.

Note also that though the described embodiment here demonstrates a two-resonator filter, higher-order filters may also be constructed from more than two individual Q-controlled resonators. From the perspective of filter design, these Q-controlled MEMS resonator elements behave exactly as passive resonators, affording all the variations on design possible with passive resonators.

Figure 12:
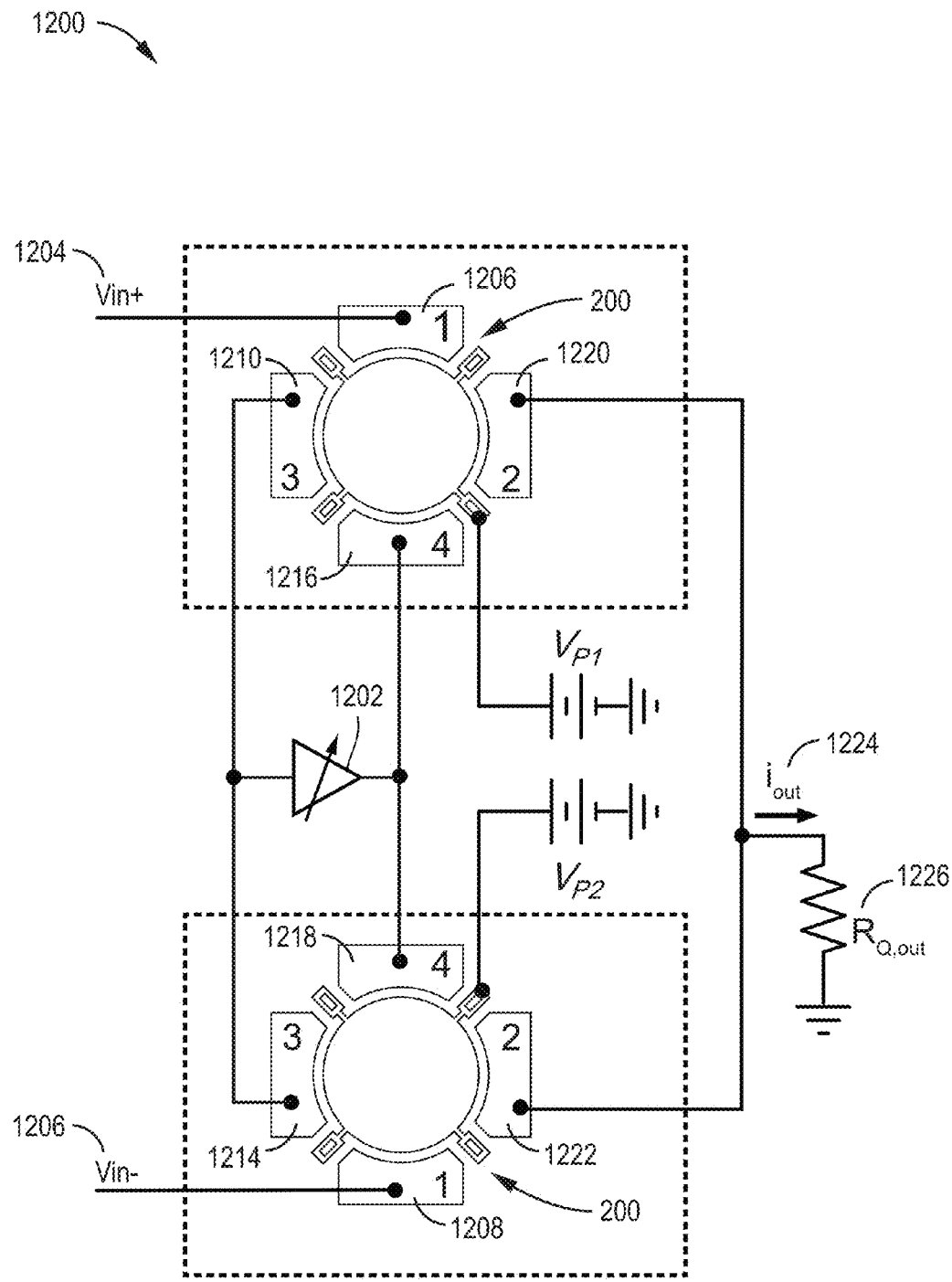
FIG. 12 is a schematic of one embodiment of a Q-boosted parallel filter comprised of two independent wine-glass disk resonators and a single amplifier circuit used to boost Q of both resonators.

Refer now to FIG. 12, which is a variant 1200 of the Q-boosted filter where multiple resonators 200 may be Q-boosted using a single amplifier 1202. Here, a positive input signal $V_{in+}$ 1204 is input into a first Q-boosted resonator 200 at input electrode 1206, and a negative input signal $V_{in-}$ 1206 is input into a second Q-boosted resonator 200 at input electrode 1208. By wiring the input of the amplifier 1202 to feedback electrodes 1212, 1214 on both Q-boosted resonators 200, and the likewise wiring the amplifier 1202 output to feedback electrodes 1216, 1218 on each Q-boosted resonators 200 simultaneously, Q boosting is achieved for both resonators, while reducing the total power consumption that would otherwise be consumed with the use of multiple amplifiers.

This single amplifier 1202 approach additionally exposes both resonators to the same noise from the amplifier (i.e., coherent noise). As a result, when the signal is combined from output electrode 1220, 1222 to form output current $i_{out}$ 1224 into output load $R_{Q,out}$ 1226, the comparative phase response of the resonators in the passbands cancels this noise, providing a filter with, at least theoretically, no added noise from the process of Q-boosting resonators. Of course, this approach may also be expanded to mechanically coupled filters and filters using more than two resonators operating on a single amplifier.

From the description herein, it will be appreciated that that the present disclosure encompasses multiple embodiments which include, but are not limited to, the following:

1. A Q-boosted filter, comprising: (a) a first Q-boosted resonator, said first Q-boosted resonator comprising: (i) a resonant structure; (ii) an input electrode, an output electrode, and one or more feedback electrodes, each of said electrodes coupled to the resonant structure; (iii) an amplifier, disposed between two or more feedback electrodes that is configured to form a feedback loop with the resonant structure; (iv) wherein the gain and phase shift of the amplifier may be controlled to change an intrinsic Q of the resonant structure; (b) a second Q-boosted resonator, said second Q-boosted resonator comprising: (i) a resonant structure; (ii) an input electrode, an output electrode, and one or more feedback electrodes, each of said electrodes coupled to the resonant structure; (iii) an amplifier, disposed between two or more feedback electrodes configured to form a feedback loop with the resonant structure; (iv) wherein the gain and phase shift of the amplifier may be controlled to change an intrinsic Q of the resonant structure; (v) wherein the positive feedback loop is configured to boost an intrinsic Q of the resonant structure; and (c) a differential input signal comprising: (i) a positive polarity connection to the input electrode of the first Q-boosted resonator; (ii) a negative polarity connection to the input electrode of the second Q-boosted resonator; (d) wherein the output electrode of the first Q-boosted resonator and the output electrode of the second Q-boosted resonator are connected together to provide a Q-boosted filter output.

2. The Q-boosted filter of any preceding embodiment, wherein each said resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

3. The Q-boosted filter of any preceding embodiment, wherein the differential input signal comprises: (a) an input transformer, comprising: (i) a primary winding; (ii) a secondary winding having a grounded center tap; (iii) the secondary winding having a positive polarity tap and a negative polarity tap; and (b) wherein an input signal connected to the primary winding results in the differential input signal produced by the positive polarity tap and the negative polarity tap.

4. The Q-boosted filter of any preceding embodiment, wherein the differential input signal is produced via a differential amplifier providing a positive polarity and a negative polarity output.

5. A Q-boosted filter, comprising: (a) a first Q-boosted resonator, said first Q-boosted resonator comprising: (i) a resonant structure; (ii) an input electrode, an output electrode, and one or more feedback electrodes, each of said electrodes electromechanically coupled to the resonant structure; (iii) an amplifier, disposed between two or more feedback electrodes that is configured to form a feedback loop with the resonant structure; (iv) wherein the gain and phase shift of the amplifier may be controlled to increase or decrease an intrinsic Q of the resonant structure; and (b) one or more additional Q-boosted resonators, said Q-boosted resonators comprising: (i) a resonant structure; (ii) an input electrode, an output electrode, and one or more feedback electrodes, each of said electrodes electromechanically coupled to the resonant structure; (iii) an amplifier, disposed between two or more feedback electrodes configured to form a feedback loop with the resonant structure; (iv) wherein the gain and phase shift of the amplifier may be controlled to increase or decrease an intrinsic Q of the resonant structure; (v) wherein the positive feedback loop is configured to boost an intrinsic Q of the resonant structure; and (c) one or more mechanical coupling beams connecting the Q-boosted resonator structure; (d) wherein the output electrodes of all Q-boosted resonators are connected together to provide a Q-boosted filter output.

6. The Q-boosted filter of any preceding embodiment, wherein each said resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive coupled formed from a semiconductor junction, and combinations of the foregoing.

7. The Q-boosted filter of any preceding embodiment, wherein the differential input signal comprises: (a) an input transformer, comprising: (i) a primary winding; and (ii) a secondary winding having a grounded center tap; (iii) the secondary winding having a positive polarity tap and a negative polarity tap; and (b) wherein an input signal connected to the primary winding results in the differential input signal produced by the positive polarity tap and the negative polarity tap.

8. The Q-boosted filter of any preceding embodiment, wherein the differential input signal is produced via a differential amplifier providing a positive polarity output and a negative polarity output from a balanced input signal.

9. A Q-boosted filter, comprising: (a) a first Q-boosted resonator, said first Q-boosted resonator comprising: (i) a resonant structure; (ii) an input electrode, an output electrode, a feedback input electrode, and a feedback output electrode, each of said electrodes coupled to the resonant structure; (iii) wherein the resonant structure is configured to be biased by a tuning voltage relative to the input electrode, the output electrode, the feedback input electrode, and the feedback output electrode; (iv) wherein the resonant structure has a resonant frequency that is changed by varying the tuning voltage; and (v) an amplifier, disposed between the feedback input electrode and the feedback output electrode, that is configured to form a positive feedback loop with the resonant structure; (vi) wherein the positive feedback loop is configured to boost an intrinsic Q of the resonant structure; (b) a second Q-boosted resonator, said second Q-boosted resonator comprising: (i) a resonant structure; (ii) an input electrode, an output electrode, a feedback input electrode, and a feedback output electrode, each of said electrodes coupled to the resonant structure; (iii) wherein the resonant structure is configured to be biased by a tuning voltage relative to the input electrode, the output electrode, the feedback input electrode, and the feedback output electrode; (iv) wherein the resonant structure has a resonant frequency that is changed by varying the tuning voltage; and (v) an amplifier, disposed between the feedback input electrode and the feedback output electrode, that is configured to form a positive feedback loop with the resonant structure; (vi) wherein the positive feedback loop is configured to boost an intrinsic Q of the resonant structure; and (c) an input transformer, comprising: (i) a primary winding; (ii) a secondary winding having a grounded center tap; (iii) the secondary winding having a positive polarity connection to the input electrode of the first Q-boosted resonator; (iv) the secondary winding having a negative polarity connection to the input electrode of the second Q-boosted resonator; (d) wherein the output electrode of the first Q-boosted resonator and the output electrode of the second Q-boosted resonator are connected together to provide a Q-boosted filter output.

10. The Q-boosted filter of any preceding embodiment, wherein an input signal connected to the primary winding results in the Q-boosted filter output.

11. The Q-boosted filter of any preceding embodiment, wherein electrode coupling is selected from a group of couplings consisting of: capacitive and piezo-electric.

12. The Q-boosted filter of any preceding embodiment, wherein each resonant structure is a wine-glass disk resonator.

13. The Q-boosted filter of any preceding embodiment, wherein each resonant structure is supported above a substrate by one or more anchors.

14. The Q-boosted filter of any preceding embodiment, wherein each resonant structure tuning voltage is transmitted through one or more of the anchors.

15. A Q-boosted resonator, comprising: (a) a resonant structure; (b) an input electrode, an output electrode, a feedback input electrode, and a feedback output electrode, each of said electrodes capacitively coupled to the resonant structure; (c) wherein the resonant structure is configured to be biased by a tuning voltage relative to the input electrode, the output electrode, the feedback input electrode, and the feedback output electrode; (d) wherein the resonant structure has a resonant frequency that is changed by varying the tuning voltage; and (e) an amplifier, disposed between the feedback input electrode and the feedback output electrode, that is configured to form a positive feedback loop with the resonant structure; (f) wherein the positive feedback loop is configured to boost an intrinsic Q of the resonant structure.

16. The Q-boosted resonator of any preceding embodiment, wherein each amplifier comprises a transimpedance amplifier.

17. The Q-boosted resonator of any preceding embodiment, wherein each resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

18. The Q-boosted resonator of any preceding embodiment, wherein each resonant structure is supported above a substrate by one or more anchors.

19. The Q-boosted resonator of any preceding embodiment, wherein each resonant structure tuning voltage is transmitted through one or more of the anchors.

20. A Q-boosted filter, comprising: (a) a input transformer that couples a balanced input signal to two unbalanced Q-boosted resonators; and (b) means for filtering, comprising: (i) an input signal connected to the input transformer through the two unbalanced Q-boosted resonators; and (ii) a filtered output signal formed by a connection of two output electrodes on the respective two unbalanced Q-boosted resonators.

21. The Q-boosted filter of any preceding embodiment, wherein each unbalanced Q-boosted resonator comprises: (a) a resonant structure; (b) an input electrode, the output electrode, a feedback input electrode, and a feedback output electrode, each of said electrodes capacitively coupled to the resonant structure; (c) wherein the resonant structure is configured to be biased by a tuning voltage relative to the input electrode, the output electrode, the feedback input electrode, and the feedback output electrode; (d) wherein the resonant structure has a resonant frequency that is changed by varying the tuning voltage; and (e) an amplifier, disposed between the feedback input electrode and the feedback output electrode, that is configured to form a positive feedback loop with the resonant structure; (f) wherein the positive feedback loop is configured to boost an intrinsic Q of the resonant structure.

22. A method of Q-boosted filtering, comprising: (a) providing an input signal; (b) splitting the input signal into two signals 180° out of phase; (c) passing each of the 180° out of phase signals through a respective Q-boosted resonator; and (d) combining each output of the Q-boosted resonators into a Q-boosted filter output.

23. The method of Q-boosted filtering of any preceding embodiment, further comprising: (a) controlling a resonant frequency of each Q-boosted resonator; (b) wherein a substantially flat pass band is formed between the resonance frequencies of the two Q-boosted resonators.

24. The method of Q-boosted filtering of any preceding embodiment, wherein each Q-boosted resonator comprises: (a) a resonant structure; and (b) an input electrode, the output electrode, a feedback input electrode, and a feedback output electrode, each of said electrodes capacitively coupled to the resonant structure.

25. The method of Q-boosted filtering of any preceding embodiment, wherein controlling the resonant frequency for one of the Q-boosted resonators comprises: applying a bias voltage between the resonant structure of the Q-boosted resonator and the input electrode, the output electrode, the feedback input electrode, and the feedback output electrode, each of said electrodes capacitively coupled to the resonant structure.

26. A Q-boosted filter, comprising: (a) a first Q-boosted resonator, said first Q-boosted resonator comprising: (i) a resonant structure; and (ii) an input electrode, an output electrode, and one or more feedback electrodes, each of said electrodes coupled to the resonant structure; (b) a second Q-boosted resonator, said second Q-boosted resonator comprising: (i) a resonant structure; and (ii) an input electrode, an output electrode, and one or more feedback electrodes, each of said electrodes coupled to the resonant structure; (c) an amplifier, disposed between feedback electrodes of both Q-boosted resonators, configured to form feedback loops with both resonant structures simultaneously; (i) wherein the gain and phase shift of the amplifier may be controlled to change the Qs of the resonant structures; and (d) a differential input signal comprising: (i) a positive polarity connection to the input electrode of the first Q-boosted resonator; (ii) a negative polarity connection to the input electrode of the second Q-boosted resonator; (e) wherein the output electrode of the first Q-boosted resonator and the output electrode of the second Q-boosted resonator are connected together to provide a Q-boosted filter output.

27. The Q-boosted filter of any preceding embodiment, wherein each said resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

28. The Q-boosted filter of any preceding embodiment, wherein the differential input signal comprises: (a) an input transformer, comprising: (i) a primary winding; and (ii) a secondary winding having a grounded center tap; (iii) the secondary winding having a positive polarity tap and a negative polarity tap; (b) wherein an input signal connected to the primary winding results in the differential input signal produced by the positive polarity tap and the negative polarity tap.

29. The Q-boosted filter of any preceding embodiment, wherein the differential input signal is produced via a differential amplifier providing a positive polarity and a negative polarity output from an input signal.

30. A Q-boosted filter, comprising: (a) a first Q-boosted resonator, said first Q-boosted resonator comprising: (i) a resonant structure; and (ii) an input electrode, an output electrode, and one or more feedback electrodes, each of said electrodes electromechanically coupled to the resonant structure; (b) one or more additional Q-boosted resonators, said Q-boosted resonators comprising: (i) a resonant structure; and (ii) an input electrode, an output electrode, and one or more feedback electrodes, each of said electrodes electromechanically coupled to the resonant structure; (c) an amplifier, disposed between feedback electrodes of both Q-boosted resonators that is configured to form feedback loops with both resonant structures simultaneously; (i) wherein the gain and phase shift of the amplifier may be controlled to change the Qs of the resonant structures; and (d) one or more mechanical coupling beams connecting the Q-boosted resonator structure; (e) wherein the output electrodes of all Q-boosted resonators are connected together to provide a Q-boosted filter output.

31. The Q-boosted filter of any preceding embodiment, wherein each said resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

32. The Q-boosted filter of any preceding embodiment, wherein the differential input signal comprises: (a) an input transformer, comprising: (i) a primary winding; and (ii) a secondary winding having a grounded center tap; (iii) the secondary winding having a positive polarity tap and a negative polarity tap; (b) wherein an input signal connected to the primary winding results in the differential input signal produced by the positive polarity tap and the negative polarity tap.

33. The Q-boosted filter of any preceding embodiment, wherein the differential input signal is produced via a differential amplifier providing a positive polarity output and a negative polarity output from a balanced input signal.

34. A Q-boosted resonator, comprising: (a) a resonant structure; (b) at least four electrodes coupled to the resonant structure; (c) wherein the resonant structure is configured to be biased by a tuning voltage relative to the electrode that is an input, the electrode that is an output, the electrode that is a feedback input, and the electrode that is a feedback output; and (d) wherein the resonant structure has a resonant frequency that is changed by varying the tuning voltage; and (e) an amplifier, disposed between the feedback input electrode and the feedback output electrode, that is configured to form a positive feedback loop with the resonant structure; (f) wherein the positive feedback loop is configured to boost an intrinsic Q of the resonant structure.

35. The Q-boosted resonator of the embodiments above, (a) wherein the at least four electrodes comprise an input electrode, an output electrode, a feedback input electrode, and a feedback output electrode, each of said electrodes coupled to the resonant structure; and (b) wherein each of said electrodes is coupled by a coupling selected from a group of couplings consisting of: capacitive and piezoelectric.

36. The Q-boosted resonator of the embodiments above, wherein each amplifier comprises a transimpedance amplifier.

37. The Q-boosted resonator of the embodiments above, wherein each resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

38. The Q-boosted resonator of the embodiments above, wherein each resonant structure is supported above a substrate by one or more anchors.

39. The Q-boosted resonator any of the embodiments above, wherein each resonant structure tuning voltage is transmitted through one or more of the anchors.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A Q-boosted filter, comprising:
   (a) a first Q-boosted resonator, said first Q-boosted resonator comprising:
      (i) a resonant structure;
      (ii) an input electrode, an output electrode, and one or more feedback electrodes, each of said electrodes coupled to the resonant structure;
      (iii) an amplifier, disposed between two or more feedback electrodes that is configured to form a feedback loop with the resonant structure;
      (iv) wherein the gain and phase shift of the amplifier may be controlled to change an intrinsic Q of the resonant structure;
   (b) a second Q-boosted resonator, said second Q-boosted resonator comprising:
      (i) a resonant structure;
      (ii) an input electrode, an output electrode, and one or more feedback electrodes, each of said electrodes coupled to the resonant structure;
      (iii) an amplifier, disposed between two or more feedback electrodes configured to form a feedback loop with the resonant structure;
      (iv) wherein the gain and phase shift of the amplifier may be controlled to change an intrinsic Q of the resonant structure;
      (v) wherein the positive feedback loop is configured to boost an intrinsic Q of the resonant structure; and
   (c) a differential input signal comprising:
      (i) a positive polarity connection to the input electrode of the first Q-boosted resonator;
      (ii) a negative polarity connection to the input electrode of the second Q-boosted resonator;

(d) wherein the output electrode of the first Q-boosted resonator and the output electrode of the second Q-boosted resonator are connected together to provide a Q-boosted filter output.

2. The Q-boosted filter of claim 1, wherein each said resonant structure is selected from a group of resonators consisting of: comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

3. The Q-boosted filter of claim 1, wherein the differential input signal comprises:
  (a) an input transformer, comprising:
    (i) a primary winding;
    (ii) a secondary winding having a grounded center tap;
    (iii) the secondary winding having a positive polarity tap and a negative polarity tap; and
  (b) wherein an input signal connected to the primary winding results in the differential input signal produced by the positive polarity tap and the negative polarity tap.

4. The Q-boosted filter of claim 1, wherein the differential input signal is produced via a differential amplifier providing a positive polarity and a negative polarity output.

5. A Q-boosted filter, comprising:
  (a) a first Q-boosted resonator, said first Q-boosted resonator comprising:
    (i) a resonant structure;
    (ii) an input electrode, an output electrode, and one or more feedback electrodes, each of said electrodes electromechanically coupled to the resonant structure;
    (iii) an amplifier, disposed between two or more feedback electrodes that is configured to form a feedback loop with the resonant structure;
    (iv) wherein the gain and phase shift of the amplifier may be controlled to increase or decrease an intrinsic Q of the resonant structure; and
  (b) one or more additional Q-boosted resonators, said Q-boosted resonators comprising:
    (i) a resonant structure;
    (ii) an input electrode, an output electrode, and one or more feedback electrodes, each of said electrodes electromechanically coupled to the resonant structure;
    (iii) an amplifier, disposed between two or more feedback electrodes configured to form a feedback loop with the resonant structure;
    (iv) wherein the gain and phase shift of the amplifier may be controlled to increase or decrease an intrinsic Q of the resonant structure;
    (v) wherein the positive feedback loop is configured to boost an intrinsic Q of the resonant structure; and
  (c) one or more mechanical coupling beams connecting the Q-boosted resonator structure;
  (d) wherein the output electrodes of all Q-boosted resonators are connected together to provide a Q-boosted filter output.

6. The Q-boosted filter of claim 5, wherein each said resonant structure is selected from a group of resonators consisting of: comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive coupled formed from a semiconductor junction, and combinations of the foregoing.

7. The Q-boosted filter of claim 5, wherein the differential input signal comprises:
  (a) an input transformer, comprising:
    (i) a primary winding; and
    (ii) a secondary winding having a grounded center tap;
    (iii) the secondary winding having a positive polarity tap and a negative polarity tap; and
  (b) wherein an input signal connected to the primary winding results in the differential input signal produced by the positive polarity tap and the negative polarity tap.

8. The Q-boosted filter of claim 5, wherein the differential input signal is produced via a differential amplifier providing a positive polarity output and a negative polarity output from a balanced input signal.

9. A Q-boosted filter, comprising:
  (a) a first Q-boosted resonator, said first Q-boosted resonator comprising:
    (i) a resonant structure;
    (ii) an input electrode, an output electrode, a feedback input electrode, and a feedback output electrode, each of said electrodes coupled to the resonant structure;
    (iii) wherein the resonant structure is configured to be biased by a tuning voltage relative to the input electrode, the output electrode, the feedback input electrode, and the feedback output electrode;
    (iv) wherein the resonant structure has a resonant frequency that is changed by varying the tuning voltage; and
    (v) an amplifier, disposed between the feedback input electrode and the feedback output electrode, that is configured to form a positive feedback loop with the resonant structure;
    (vi) wherein the positive feedback loop is configured to boost an intrinsic Q of the resonant structure;
  (b) a second Q-boosted resonator, said second Q-boosted resonator comprising:
    (i) a resonant structure;
    (ii) an input electrode, an output electrode, a feedback input electrode, and a feedback output electrode, each of said electrodes coupled to the resonant structure;
    (iii) wherein the resonant structure is configured to be biased by a tuning voltage relative to the input electrode, the output electrode, the feedback input electrode, and the feedback output electrode;
    (iv) wherein the resonant structure has a resonant frequency that is changed by varying the tuning voltage; and (v) an amplifier, disposed between the feedback input electrode and the feedback output electrode, that is configured to form a positive feedback loop with the resonant structure;

(vi) wherein the positive feedback loop is configured to boost an intrinsic Q of the resonant structure; and (c) an input transformer, comprising:
(i) a primary winding;
(ii) a secondary winding having a grounded center tap;
(iii) the secondary winding having a positive polarity connection to the input electrode of the first Q-boosted resonator;
(iv) the secondary winding having a negative polarity connection to the input electrode of the second Q-boosted resonator;

(d) wherein the output electrode of the first Q-boosted resonator and the output electrode of the second Q-boosted resonator are connected together to provide a Q-boosted filter output.

10. The Q-boosted filter of claim 9, wherein an input signal connected to the primary winding results in the Q-boosted filter output.

11. The Q-boosted filter of claim 10, wherein electrode coupling is selected from a group of couplings consisting of: capacitive and piezo-electric.

12. The Q-boosted filter of claim 10, wherein each resonant structure is a wine-glass disk resonator.

13. The Q-boosted filter of claim 10, wherein each resonant structure is supported above a substrate by one or more anchors.

14. The Q-boosted filter of claim 13, wherein each resonant structure tuning voltage is transmitted through one or more of the anchors.

15. A Q-boosted resonator, comprising:
(a) a resonant structure;
(b) an input electrode, an output electrode, a feedback input electrode, and a feedback output electrode, each of said electrodes capacitively coupled to the resonant structure;
(c) wherein the resonant structure is configured to be biased by a tuning voltage relative to the input electrode, the output electrode, the feedback input electrode, and the feedback output electrode;
(d) wherein the resonant structure has a resonant frequency that is changed by varying the tuning voltage; and
(e) an amplifier, disposed between the feedback input electrode and the feedback output electrode, that is configured to form a positive feedback loop with the resonant structure;
(f) wherein the positive feedback loop is configured to boost an intrinsic Q of the resonant structure.

16. The Q-boosted resonator of claim 15, wherein each amplifier comprises a transimpedance amplifier.

17. The Q-boosted resonator of claim 15, wherein each resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

18. The Q-boosted resonator of claim 15, wherein each resonant structure is supported above a substrate by one or more anchors.

19. The Q-boosted resonator of claim 18, wherein each resonant structure tuning voltage is transmitted through one or more of the anchors.

20. A Q-boosted filter, comprising:
(a) a input transformer that couples a balanced input signal to two unbalanced Q-boosted resonators; and
(b) means for filtering, comprising:
(i) an input signal connected to the input transformer through the two unbalanced Q-boosted resonators; and
(ii) a filtered output signal formed by a connection of two output electrodes on the respective two unbalanced Q-boosted resonators;
(c) wherein each unbalanced Q-boosted resonator comprises:
(i) a resonant structure;
(ii) an input electrode, the output electrode, a feedback input electrode, and a feedback output electrode, each of said electrodes capacitively coupled to the resonant structure;
(iii) wherein the resonant structure is configured to be biased by a tuning voltage relative to the input electrode, the output electrode, the feedback input electrode, and the feedback output electrode; and
(iv) wherein the resonant structure has a resonant frequency that is changed by varying the tuning voltage; and
(v) an amplifier, disposed between the feedback input electrode and the feedback output electrode, that is configured to form a positive feedback loop with the resonant structure;
(vi) wherein the positive feedback loop is configured to boost an intrinsic Q of the resonant structure.

21. A method of Q-boosted filtering, comprising:
(a) providing an input signal;
(b) splitting the input signal into two signals 180° out of phase;
(c) passing each of the 180° out of phase signals through a respective Q-boosted resonator;
(d) combining each output of the Q-boosted resonators into a Q-boosted filter output; and
(e) controlling a resonant frequency of each Q-boosted resonator;
(f) wherein a substantially flat pass band is formed between the resonance frequencies of the two Q-boosted resonators.

22. A method of Q-boosted filtering, comprising:
(a) providing an input signal;
(b) splitting the input signal into two signals 180° out of phase;
(c) passing each of the 180° out of phase signals through a respective Q-boosted resonator;
(d) combining each output of the Q-boosted resonators into a Q-boosted filter output;
(e) controlling a resonant frequency of each Q-boosted resonator;
(f) wherein a substantially flat pass band is formed between the resonance frequencies of the two Q-boosted resonators;
(g) wherein each Q-boosted resonator comprises:
(i) a resonant structure; and (ii) an input electrode, the output electrode, a feedback input electrode, and a feedback output electrode, each of said electrodes capacitively coupled to the resonant structure.

23. The method of Q-boosted filtering of claim 22, wherein controlling the resonant frequency for one of the Q-boosted resonators comprises applying a bias voltage between the resonant structure of the Q-boosted resonator and the input electrode, the output electrode, the feedback input electrode, and the feedback output electrode, each of said electrodes capacitively coupled to the resonant structure.

24. A Q-boosted filter, comprising:
    (a) a first Q-boosted resonator, said first Q-boosted resonator comprising:
       (i) a resonant structure; and
       (ii) an input electrode, an output electrode, and one or more feedback electrodes, each of said electrodes coupled to the resonant structure;
    (b) a second Q-boosted resonator, said second Q-boosted resonator comprising:
       (i) a resonant structure; and
       (ii) an input electrode, an output electrode, and one or more feedback electrodes, each of said electrodes coupled to the resonant structure;
    (c) an amplifier, disposed between feedback electrodes of both Q-boosted resonators, configured to form feedback loops with both resonant structures simultaneously;
    wherein the gain and phase shift of the amplifier may be controlled to change the Qs of the resonant structures; and
    (d) a differential input signal comprising:
       (i) a positive polarity connection to the input electrode of the first Q-boosted resonator;
       (ii) a negative polarity connection to the input electrode of the second Q-boosted resonator;
    (e) wherein the output electrode of the first Q-boosted resonator and the output electrode of the second Q-boosted resonator are connected together to provide a Q-boosted filter output.

25. The Q-boosted filter of claim 24, wherein each said resonant structure is selected from a group of resonators consisting of: comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

26. The Q-boosted filter of claim 24, wherein the differential input signal comprises:
    (a) an input transformer, comprising:
       (i) a primary winding; and
       (ii) a secondary winding having a grounded center tap;
       (iii) the secondary winding having a positive polarity tap and a negative polarity tap;
    (b) wherein an input signal connected to the primary winding results in the differential input signal produced by the positive polarity tap and the negative polarity tap.

27. The Q-boosted filter of claim 24, wherein the differential input signal is produced via a differential amplifier providing a positive polarity and a negative polarity output from an input signal.

28. A Q-boosted filter, comprising:
    (a) a first Q-boosted resonator, said first Q-boosted resonator comprising:
       (i) a resonant structure; and
       (ii) an input electrode, an output electrode, and one or more feedback electrodes, each of said electrodes electromechanically coupled to the resonant structure;
    (b) one or more additional Q-boosted resonators, said Q-boosted resonators comprising:
       (i) a resonant structure; and
       (ii) an input electrode, an output electrode, and one or more feedback electrodes, each of said electrodes electromechanically coupled to the resonant structure;
    (c) an amplifier, disposed between feedback electrodes of both Q-boosted resonators that is configured to form feedback loops with both resonant structures simultaneously;
       (i) wherein the gain and phase shift of the amplifier may be controlled to change the Qs of the resonant structures; and
    (d) one or more mechanical coupling beams connecting the Q-boosted resonator structure;
    (e) wherein the output electrodes of all Q-boosted resonators are connected together to provide a Q-boosted filter output.

29. The Q-boosted filter of claim 28, wherein each said resonant structure is selected from a group of resonators consisting of: comb-driven resonators, piezo coupled resonators, ring resonators, contour mode ring resonators, wineglass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

30. The Q-boosted filter of claim 28, wherein the differential input signal comprises:
    (a) an input transformer, comprising:
       (i) a primary winding; and
       (ii) a secondary winding having a grounded center tap;
       (iii) the secondary winding having a positive polarity tap and a negative polarity tap;
    (b) wherein an input signal connected to the primary winding results in the differential input signal produced by the positive polarity tap and the negative polarity tap.

31. The Q-boosted filter of claim 28, wherein the differential input signal is produced via a differential amplifier providing a positive polarity output and a negative polarity output from a balanced input signal.

32. A Q-boosted resonator, comprising:
    (a) a resonant structure;
    (b) at least four electrodes coupled to the resonant structure;
    (c) wherein the resonant structure is configured to be biased by a tuning voltage relative to the electrode that is an input, the electrode that is an output, the electrode that is a feedback input, and the electrode that is a feedback output; and (d) wherein the resonant structure has a resonant frequency that is changed by varying the tuning voltage; and (e) an amplifier, disposed between the feedback input electrode and the feedback output electrode, that is configured to form a positive feedback loop with the resonant structure;

(f) wherein the positive feedback loop is configured to boost an intrinsic Q of the resonant structure; and (g) wherein each resonant structure is selected from a group of resonators consisting of: comb-driven resonators, piezo coupled resonators, ring resonators, contour mode ring resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing.

33. A Q-boosted resonator, comprising:

(a) a resonant structure;

(b) at least four electrodes coupled to the resonant structure;

(c) wherein the resonant structure is configured to be biased by a tuning voltage relative to the electrode that is an input, the electrode that is an output, the electrode that is a feedback input, and the electrode that is a feedback output; and (d) wherein the resonant structure has a resonant frequency that is changed by varying the tuning voltage; and (e) an amplifier, disposed between the feedback input electrode and the feedback output electrode, that is configured to form a positive feedback loop with the resonant structure;

(f) wherein the positive feedback loop is configured to boost an intrinsic Q of the resonant structure; and (g) wherein each resonant structure is supported above a substrate by one or more anchors.

34. The Q-boosted resonator of claim 33, wherein each resonant structure tuning voltage is transmitted through one or more of the anchors.

* * * * *